United States Patent
Nagumo

(10) Patent No.: US 6,194,960 B1
(45) Date of Patent: Feb. 27, 2001

(54) DRIVER IC

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/407,323

(22) Filed: Sep. 28, 1999

(30) Foreign Application Priority Data

Sep. 29, 1998 (JP) .................................................. 10-274621

(51) Int. Cl.[7] .................................................. H01L 25/00
(52) U.S. Cl. .......................................... 327/565; 327/515
(58) Field of Search ..................................... 327/514, 515, 327/564, 565, 566

(56) References Cited

U.S. PATENT DOCUMENTS

| | | | |
|---|---|---|---|
| 5,121,036 | * 6/1992 | Fuji ........................................ | 307/303 |
| 5,717,359 | * 2/1998 | Matsui et al. ......................... | 327/565 |
| 5,734,406 | * 3/1998 | Nakamura et al. ................... | 347/132 |
| 5,828,400 | * 10/1998 | Fleming ................................. | 347/238 |

FOREIGN PATENT DOCUMENTS 06297765   12/1994   (JP) .

* cited by examiner

Primary Examiner—Jeffrey Zweizig
(74) Attorney, Agent, or Firm—Akin, Gump, Strauss, Hauer & Feld, L.L.P.

(57) ABSTRACT

A chip module includes a driver IC chip and a driven IC mounted on the drive IC by the use of anisotropic film. The driver IC has a plurality of drive-elements that drive driven-elements in the driven IC chip. A plurality of drive-elements are aligned at predetermined intervals. A power-supplying electrode extends along the plurality of drive-elements and distributes electric power to individual drive-elements. A plurality of power supplying electrode pads are provided on the power-supplying electrode. The power-supplying electrode pads receive electric power from outside and supply the electric power to the power-supplying electrode. The n-th power-supplying electrode pad is positioned at a location given by $L(2n-1)/2N$ where N is a number of the power-supplying electrode pads, n is an integer from 1 to N, and L is a total length of the power-supplying electrode. There are provided a plurality of drive electrode pads through which the drive-elements are connected to the driven elements. The plurality of drive electrode pads are aligned at predetermined intervals. There may be provided a plurality of dummy drive electrode pads next to the endmost ones of the plurality of drive electrode pads.

11 Claims, 20 Drawing Sheets

DRIVER IC

BACKGROUND OF THE INVENTION

1. Field of the Invention

The present invention relates to a driver IC having a group of drive elements that individually drive external elements such as light-emitting diodes for an exposing unit for an electrophotographic printer, heat-generating resistors for a thermal printer, display elements for a display.

2. Description of the Related Art

One conventional driver IC is an LED driver IC that drives a plurality of light-emitting diodes (LED) of an LED array. The LED driver ICs and LED arrays are combined to form an LED head for use in the electrophotographic printer.

FIG. 17 illustrates a layout of the conventional driver IC fabricated using the technique disclosed in Japanese Patent Preliminary Publication (KOKAI) No. 6-297765. FIG. 17 also shows a see-through view of a layout of an LED array 100 for convenience of explanation. The LED array 100 includes 192 LEDs. Each chip of the driver IC 400 drives 192 LEDs.

The driver IC includes a shift register 201, a set of latches 202, a set of pre-buffers 204, a set of drive transistors 205, a set of input electrode pads 210, a set of drive electrode pads 220, a supply electrode 230, and supply electrode pads 431. The shift register 201 includes flip-flops FF1–FF192. The set of latches 202 includes latches LT1–LT192. The set of pre-buffers 204 includes pre-buffers G1–G192. The set of drive transistors 205 includes drive transistor Tr1–Tr192. The set of drive electrode pads 220 includes drive electrode pads DO1–DO192. The reference "A" denotes the region between even-numbered drive electrode pads (DO2, DO4, . . . , DO192) and the supply electrode 230.

The driver IC 400 is in the shape of a rectangle chip having long sides and short sides. The set of the drive electrode pads 220 extends along one of the long sides of the driver IC 400 and includes drive electrode pads DO1–DO192 arranged in two rows with one row staggered with respect to the other. The drive electrode pads DO1–DO192 are used to drive 192 LEDs of the LED array 100, each pad being connected to a corresponding LED. The sets of input electrode pads 210 are aligned along the other long side of the driver IC 400 and receive signals from outside.

The shift register 201, set of latches 202, set of pre-buffers 204, set of drive transistors 205 are aligned in this order from the input electrode pads 210 side to the drive electrode pads 220 side. The flip-flops FF1–FF192, latches LT1–LT192, pre-buffers G1–G192, and drive transistors Tr1–Tr192 are all aligned in the direction of the long side of the driver IC 400 at the same intervals as the drive electrode pads 220.

The supply electrode 230 is an aluminum electrode having a width W, and is formed between the set of drive transistors 205 and the set of pre-buffers 204. The supply electrode 230 extends from one short side of the driver IC 400 to the other in the direction of the long side of the driver IC 400.

Provided on the supply electrode 230 are two electrode pads 431 via which drive supply VDDH is supplied from outside. The sources of the drive transistors Tr1–Tr192 are connected to corresponding nearby supply electrodes 230.

The two supply electrode pads 431 are at locations corresponding to the drive transistors T64 and Tr132, respectively.

The LED array 100 is in the shape of a rectangle chip having long sides and short sides, and has a set of anode electrode pad 120 that includes anode electrode pads LI1–LI192. The set of the anode electrode pads 120 extends along one of the long sides of the chip of LED array 100. The anode electrode pads LI1–LI192 are arranged in two rows with one row staggered with respect to the other. The anode electrode pads LI1–LI192 are connected to the corresponding drive electrode pads DO1–DO192 using a later described ACF. An i-th anode electrode pad LIi is at a location corresponding to an i-th drive electrode pad DOi. The input electrode pads 210 are aligned along the other long side of the LED array 100.

FIG. 18 is a lateral cross-sectional view of a chip module having the LED array 100 and prior art driver IC 400, taken along lines C–C' of FIG. 17.

Referring to FIG. 18, there are provided light emitting elements 101, individual anode electrodes (Al electrode) 102, and anode electrode pads (Al electrode pad) 103 on the surface of the LED array 100. Each combination of light emitting element 101, individual anode electrode 102, and anode electrode pad 103 forms one of a plurality of LEDs. Each anode electrode pad 103 is connected to a corresponding anode electrode pad (LI1–LI192) of FIG. 17. There is provided a common cathode electrode 104 on the opposite surface of the LED array 100.

The LED array 100 has LEDs of an end-surface emission type in which light is emitted in a direction parallel to the surface of the pn junction of the light emitting element 101. The anode electrode pad 103 is formed in integrally continuous with the anode electrode 102, and is connected to one end of a corresponding drive electrode pad 221 of the driver IC 400. The other end of the anode electrode 102 is connected to the p-type region of the light-emitting element 101. The common cathode electrode 104 is connected to the n-type region of all the light emitting elements 101 (i.e., n-type substrate of the LED array).

The driver IC 400 has the input electrode pad 211 that is a part of the set of input electrode pad 210 (FIG. 17), the drive electrode pad 221 that is a part of the set of drive electrode pads 220 (FIG. 17), and the supply electrode pad 431.

The input electrode pad 211 includes an Al-electrode pad 211a and an Au (gold)-bump 211b formed on the Al electrode pad 211a. The drive electrode pad 221 is the i-th drive electrode pad DOi of FIG. 17 and includes an Al-electrode pad 221a and an Au (gold)-bump 221b formed on the Al electrode pad 221a.

The supply electrode pad 431 includes an Al-electrode pad 431a and an Au-bump 431b. The Al-electrode pad 431a is on an area of the supply electrode 230 near the drive transistor Tr132 (i.e., near drive electrode pad DO132).

The set of drive electrode pads 220 of the driver IC 400 is electrically connected with the LED array 100 through an anisotropic conductive film (referred to ACF), thereby forming a chip module. Dispersing electrically conductive gold-plated particles 303b in a thermosetting ACF resin 303a forms an ACF 303.

The driver IC 400 and LED array 100 are connected in an ACF connection process as follows:

The LED array is placed on the driver IC with the ACF sandwiched between the anode electrode pads 103 and the drive electrode pads 221. The LED array is mounted to the driver IC such that the anode electrode pads 103 of the LED array 100 are aligned with the corresponding drive electrode pads 221 of the driver IC 400. Then, the assembly of the driver IC 400 and LED array 100 is heated so that the ACF resin 303a is softened. Then, the LED array 100 is pressed against the driver IC 400 and the assembly is again heated at an elevated temperature. Thereafter, the assembly is cooled so that the ACF resin is set. In this manner, the both chips are mechanically bonded to each other and the gaps between the two are sealed. The conductive particles 303*b* sandwiched between the anode electrode pads 103 and Au-bumps 221*b* allows electrical connection between anode electrode pads 103 and corresponding drive electrode pads 221 without using wires.

The chip module is bonded to a printed circuit in the die-bonding process. During the die-bonding process, the input electrode pads 211 and the supply electrode pads 431 of the driver IC 400 are connected to corresponding signal output electrode pads and supply electrode pads on the printed circuit board through bonding wires (gold wires) 302*a* and 302*b*, respectively. The common cathode electrode 104 of the LED array 100 is connected to a ground electrode pad on the printed circuit board through a later described bonding wire 302*c* (FIG. 13).

However, as shown in FIG. 17, when all of the LEDs of the LED array 100 are driven simultaneously, drive currents supplied through the drive transistors Tr1–Tr192 to the LD1–LD192 are different from LED to LED (i. e., from dot to dot). There are two reasons for the variations in drive current: the first is the potential on the supply electrode 230 is not uniformly distributed along the supply electrode 230 and the second is the increases in the connection resistance between the drive electrode pads 221 of the driver IC 400 and the anode electrode pads 103.

When all the LEDs (all dots) of the LED array 100 are driven simultaneously, the drive current is supplied to the drive transistors Tr1–Tr192 through the resistance of wires and wire-bonded portions so that each LEDi receives the drive current through a corresponding drive transistor Tri. A problem with the prior art driver IC 400 is voltage drops resulting from not only the resistance in the bonding wires and voltage drops but also resistance between adjacent nodes of the supply electrode 230. The variations in drive current due to the voltage drops between adjacent nodes of the supply electrodes 230 becomes large with increasing number of LEDs to be driven.

FIG. 19 illustrates the distribution of potential along the supply electrode 230 when all the LEDs are energized simultaneously. FIG. 19 plots dot numbers as the abscissa and potentials as the ordinate.

The supply electrodes 431 of the driver IC 400, through which drive supply VDDH is supplied from an external source, are provided at nodes S64 and S132. The potential on the supply electrode 230 is a maximum at nodes S64 and S132, and decreases with increasing distance from the nodes S64 and S132 due to voltage drops across residual resistance between adjacent nodes of the supply electrodes 230. The potential is a minimum at nodes S1 and S192. Correspondingly, the current density is a maximum near the nodes S64 and S132 and decreases with increasing distance from the nodes S64 and S132.

Thus, if the resistances between adjacent nodes of the supply electrodes 230 can be decreased, the variations in drive current between dots can be decreased. However, if the width W (FIG. 17) of the supply electrode 230 is made wider in an attempt to decrease the wire resistance, then the driver IC will be large in size.

FIG. 20 illustrates the ACF 303 when it is crushed between the driver IC 400 and LED array 100.

As shown in FIG. 20, the ACF 303 may cover only a part of the drive pads DO1, DO191, and DO192 which are located at endmost of the two rows of drive electrode pads. Therefore, the number of conductive particles sandwiched between the Au bumps 221 of the drive electrode pad 220 and corresponding anode electrodes pads 103 is less than when the ACF 303 completely covers the drive pads DO1, DO191, and DO192. This causes the resistance between the drive electrode pads DO1, DO191, DO192 and the corresponding anode electrode pads 103 to increase, thereby reducing drive currents supplied to LD1, LD191, LD192 to result in large variations in drive current between dots.

The non-uniform potential along the supply electrode 230 and the variations in drive current are sources of deteriorated print quality of electrophotographic printers.

The worst case is that the electrical connections between some drive electrode pads and corresponding anode electrode pads may become completely open. Such poor electrical connection reduces the yield of chip module formed of the driver IC 400 and LED array 100.

The prior art driver IC 400 requires an unused area where no electrical elements are fabricated, the unused area being in a region extending over a part of the region A between the rows of the set of drive electrode pads 220 and supply electrode 230. This unused area makes the chip size of the driver IC 400 large. The unused area is provided for the following reason.

During the ACF connection process described with reference to FIG. 18, the softened ACF 303 spreads toward the supply electrode pads 431. A certain thickness of the ACF before heating is required in order that a sufficient number of conductive particles 303*b* are present between the anode electrode pads 103 of the LED array 100 and the Au bumps 221*b* of the driver IC 400 for good electrical connection. Some excess amount of ACF 303 should be allowed to spread toward the supply electrode pads 431.

If the ACF 303 spreads too far, it may cover the Au bump 431*b*, being an obstacle to bonding the wire to the Au bump 431*b*. The region A serves to be a buffer area to accommodate excess melted ACF.

SUMMARY OF THE INVENTION

The present invention was made in view of the aforementioned drawbacks.

An object of the invention is to provide a driver IC that minimizes variations in drive current supplied to light emitting diodes.

Another object of the invention is to provide a driver IC of small chip size.

Still another object of the invention is to eliminate poor electrical connection between the driver IC and the IC driven by the driver IC.

A chip module includes a driver IC chip and a driven IC mounted on the driver IC by the use of anisotropic film. The driver IC has a plurality of drive-elements that drive driven-elements in the driven IC chip. A plurality of drive-elements are aligned at predetermined intervals. A power-supplying electrode extends along the plurality of drive-elements and distributes electric power to the plurality of drive-elements. A plurality of power supplying electrode pads is provided on the power-supplying electrode. The power-supplying electrode pads receive electric power from outside and supply the electric power to the power-supplying electrode. The n-th power-supplying electrode pad is positioned at a location given by $L(2n-1)/2N$ where N is a number of the power-supplying electrode pads, n is an integer from 1 to N, and L is a total length of the power-supplying electrode.

A driver IC chip has a plurality of drive-elements which drive corresponding ones of a plurality of driven elements. The driver IC chip has a row of a plurality of drive-elements. A power-supplying electrode extends along the row and distributing electric power to the plurality of drive-elements. The power-supplying electrode has an Au electrode layer. Power-supplying electrode pads are provided on the power-supplying electrode and receiving electric power from outside. A row of plurality of drive-electrode pads are provided. The plurality of drive-elements are connected to corresponding ones of the driven elements.

A driver IC chip has a plurality of drive-elements, which drive corresponding ones of a plurality of driven elements. The driver IC chip comprises a row of a plurality of drive-elements aligned at predetermined intervals, and a row of a plurality of drive-electrode pads through which the plurality drive-elements are connected to the corresponding ones of the driven elements. At least one dummy drive-electrode pad is positioned next to each of end most ones of the plurality of drive-electrode pads. The dummy drive-electrode pad is positioned at the same intervals as the plurality of drive-electrode pads. The dummy drive-electrode pad is of the same size as the drive-electrode pads.

A chip module comprising a driver IC chip and a driven IC chip that is mounted on and driven by the driver IC chip. The driver IC chip has a plurality of drive-elements, which drive corresponding ones of a plurality of driven-elements of the driven IC chip. The driven IC chip is mechanically and electrically connected to the driver IC chip through an anisotropic film. The driver IC chip comprises a plurality of drive-elements aligned at predetermined intervals and a plurality of drive-electrode pads. The plurality of drive-elements are connected through the plurality of drive electrode pads to corresponding ones of the driven-elements. The plurality of drive-electrode pads are aligned at the predetermined intervals. At least first and second dummy drive-electrode pads are positioned next to each of endmost ones of the plurality of drive-electrode pads. The first and second dummy drive-electrode pads are of the same size as the drive-electrode pads and are positioned at same intervals as the plurality of drive-electrode pads. At least first and second test pads are connected to the first and second dummy electrode pads, respectively. The at least first and second test pads are positioned outside an area in which the driven IC chip is mounted. The driven IC chip comprises a plurality of driven elements aligned at predetermined intervals. The plurality of driven-elements are driven by the drive-elements. The plurality driven elements are connected to corresponding ones of the drive-elements through a plurality of driven electrode pads. The plurality of driven-electrode pads are aligned at the predetermined intervals. At least first and second dummy driven electrode pads positioned next to each of endmost ones of the plurality of driven electrode pads. The at least first and second dummy driven electrode pads are aligned with the at least first and second dummy drive-electrode pads when the driven IC chip is mounted to the driver IC chip. The first and second dummy driven electrode pads are electrically connected to each other. When the driven IC chip is mounted on the driver IC chip with the anisotropic film sandwiched therebetween, the first and second test pads have electrical continuity through the anisotropic film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

A driver IC according to the present invention, which drives an LED array, will be described. The driver IC is electrically connected through ACF (Anisotropic Conductive Film) to the LED array. This assembly serves as a chip module that is a part of an LED head for use in an electrophotographic printer. In the electrophotographic printer, the LED head selectively illuminates the charged surface of a photoconductive drum in accordance with print data, thereby forming an electrostatic latent image. The latent image is then developed with toner into a toner image. The toner image is transferred to a print medium and subsequently fused.

Figure 1:
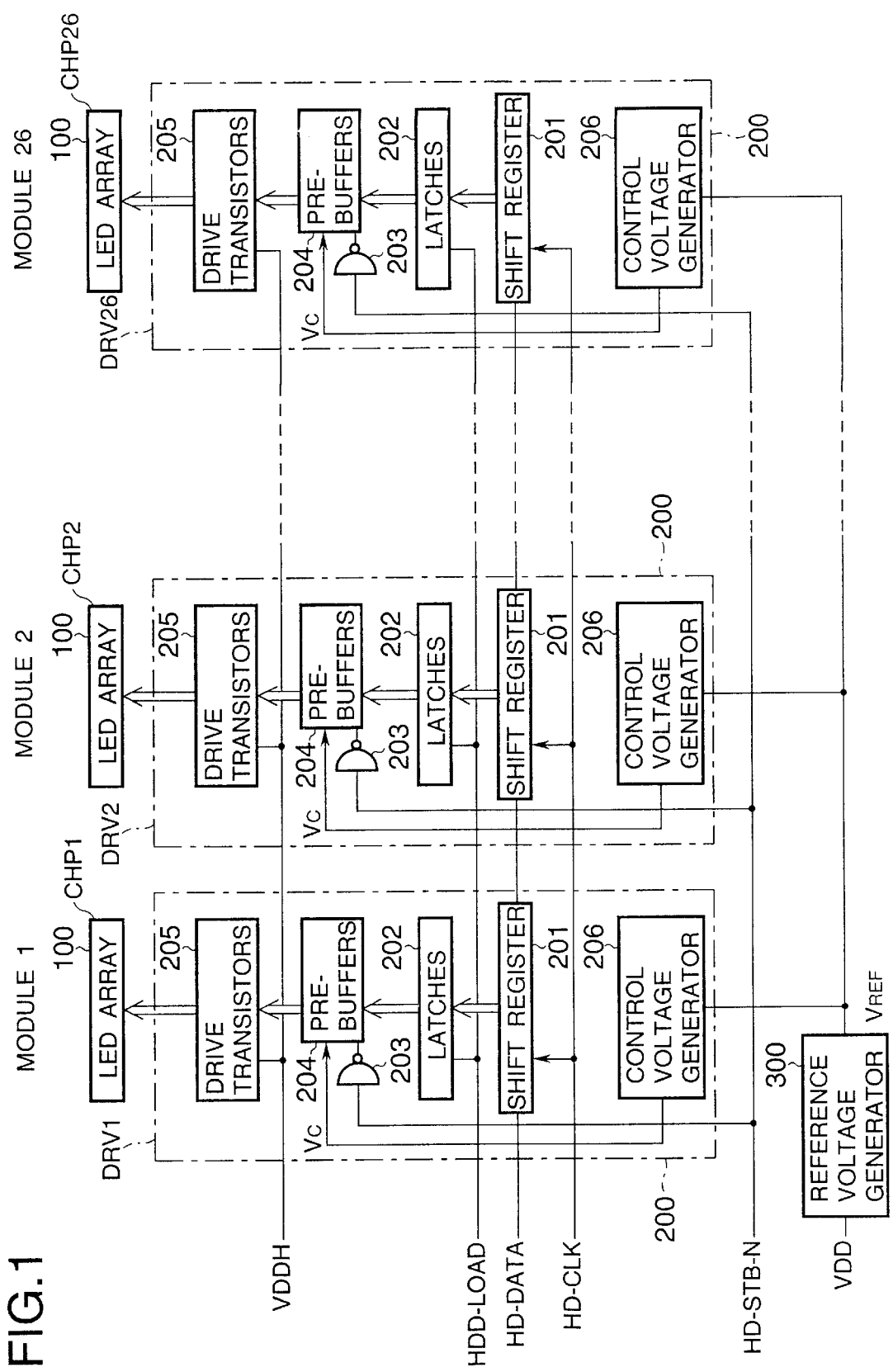
FIG. 1 is a block diagram showing the LED head.

FIG. 1 is a block diagram showing the LED head 19. The LED head 19 includes 26 LED arrays 100 (CHP1–CHP26), 26 driver ICs 200 (DRV1–DRV26), and a reference voltage generator 300.

Each of the LED arrays 100 includes 192 LEDs aligned in a straight row.

Each of the driver IC 200 includes a shift register 201, a set of latches 202, an inverter 203, a set of pre-buffers 204, a set of drive transistors 205, and a control voltage generator 206.

The shift register 201 includes 192 flip-flops cascaded. The shift registers 201 of the driver ICs DRV1–DRV26 are also cascaded. The set of latches 202 includes 192 latches that hold the bit data for 192 dots of the print data HD-DATA upon the latch signal HD-LOAD. The inverter 203 inverts the strobe signal HD-STB-N in polarity. The set of pre-buffers 204 includes 192 pre-buffer circuits and the set of drive transistors 205 includes 192 drive transistors (PMOS transistors).

The reference voltage generator 300 generates a reference voltage VREF and supplies it to the control voltage generators 206 of the driver ICs DRV1–DRV26. The control voltage generator 206 provides the control voltage Vc to the set of pre-buffers 204, the control voltage Vc controlling the values of drive currents Idrv supplied through the drive transistors 205 to the LED array 100.

Figure 2:
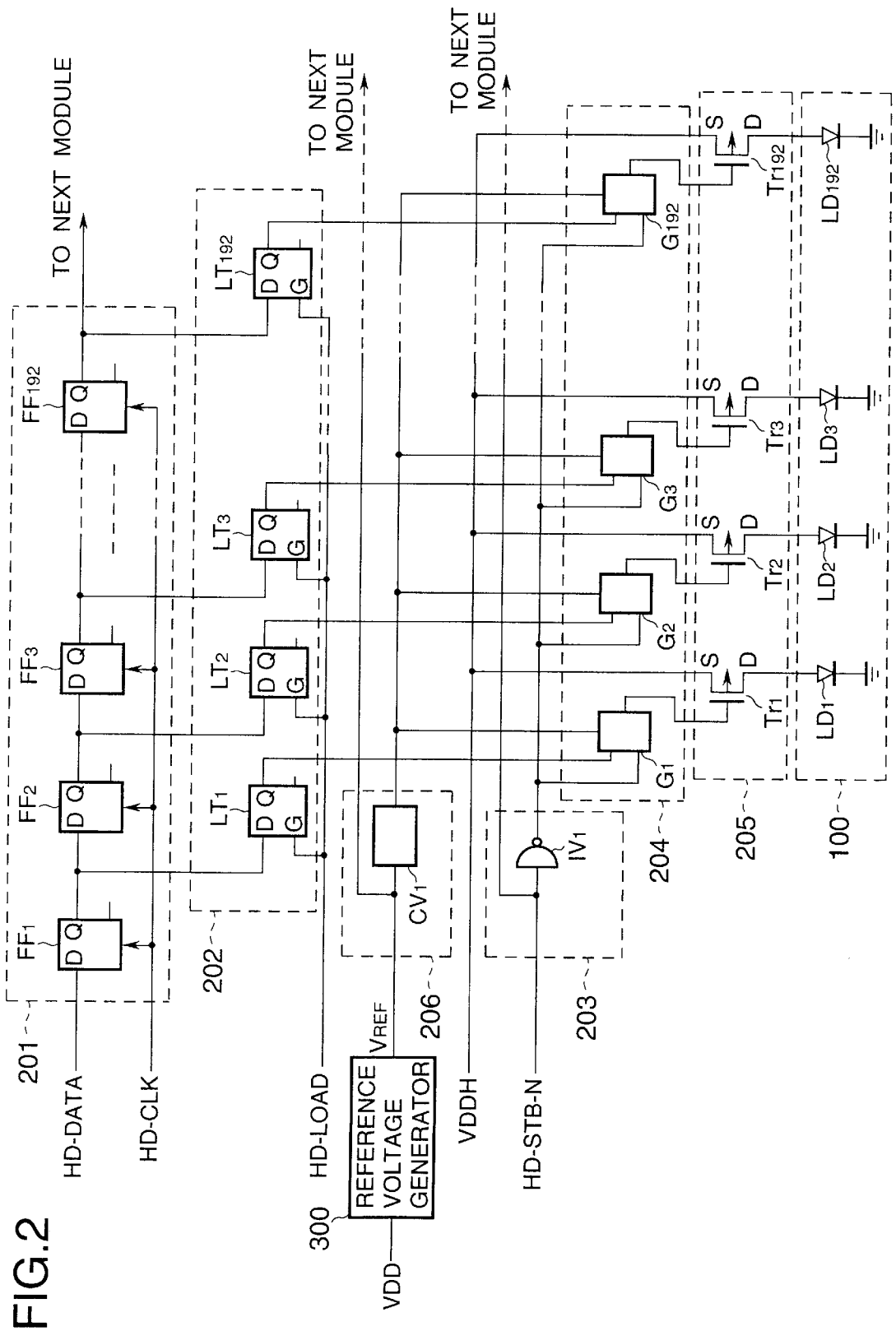
FIG. 2 is a schematic diagram of the LED head of an electrophotographic printer.

FIG. 2 is a schematic diagram of the driver IC DRV1 and the LED array CHP1 of FIG. 1, which is a part of the LED head 19. If the print resolution of the electrophotographic printer is 600 DPI, each line printed on A4 size paper includes a maximum of 4992 dots. The circuit shown in FIG. 2 includes a part of 4992 dots, i.e., 192 dots. The construction will be described with reference to FIG. 2.

The flip-flops FF1–FF192, latches LT1–LT192, and inverter IV1 of FIG. 2 correspond to the shift register 201, set of latches 202, and inverter 203 of FIG. 1, respectively. The pre-buffers G1–G192, drive transistors Tr1–Tr192, and control voltage generator CV1 of FIG. 2 correspond to the set of pre-buffers 204, set of drive transistors 205, and control voltage generator 206 of FIG. 1, respectively.

Referring to FIG. 2, the LED head 19 receives print data HD-DATA, clock signal HD-CLK, latch signal HD-LOAD, strobe signal HD-STB-N from a print controller 1. The LED head 19 also receives drive supply VDDH. Inverters IV1–IV26 invert the strobe signal HD-STB-N.

Flip-flops FF1–FF192 are cascaded such that the output terminal Q of a flip-flop is connected to the input terminal D of the next flip-flop. Thus, the flip-flops FF1–FF192 serve as a shift register as a whole. The input terminal D of flip-flop FF1 receives the print data HD-DATA. The clock terminals of the flip-flops FF1–FF192 receive clock signal HD-CLK. A total of 26 driver ICs are cascaded such that a total of 4992 flip-flops are cascaded to hold 4992 dots. Bit data of the print data HD-DATA is shifted from one flip-flop to the next in synchronism with clock signal HD-CLK, so that bit data corresponding 4 to 992 dots for one line is held in the flip-flops.

An input terminal D of the k-th latch is connected to a non-inverted output terminal Q of the k-th flip-flop. Latch input terminals G of latches LT1–LT192 receive corresponding latch signals HD-LOAD. Upon latch signal HD-LOAD, the k-th latch LTk latches the bit data held on the k-th flip-flop FFk.

One of two input terminals of the k-th pre-buffer Gk is connected to the non-inverted output terminal Q of the k-th latch LTk, and the other is connected to the inverted strobe signal HD-STB-N. The output terminal of the k-th pre-buffer Gk outputs a logical product of the k-th bit data of the print data HD-DATA for one line and the inverted strobe signal HD-STB-N. The output of the k-th pre-buffer Gk drives the k-th drive transistor Trk.

A drain terminal of the k-th drive transistor Trk is connected to the anode of the k-th LED LDk. The sources of the drive transistors Tr1–Tr192 receive drive supply VDDH. The cathode of the k-th LED LDk is grounded. When the k-th drive transistor Trk is driven to conduct, a drive current is supplied to the corresponding LED LDk. Thus, for a length of time during which the strobe signal HD-STB-N is inputted, the light emitting diodes LD1–LD192 emit light in accordance with the bit data for one line.

Figure 3:
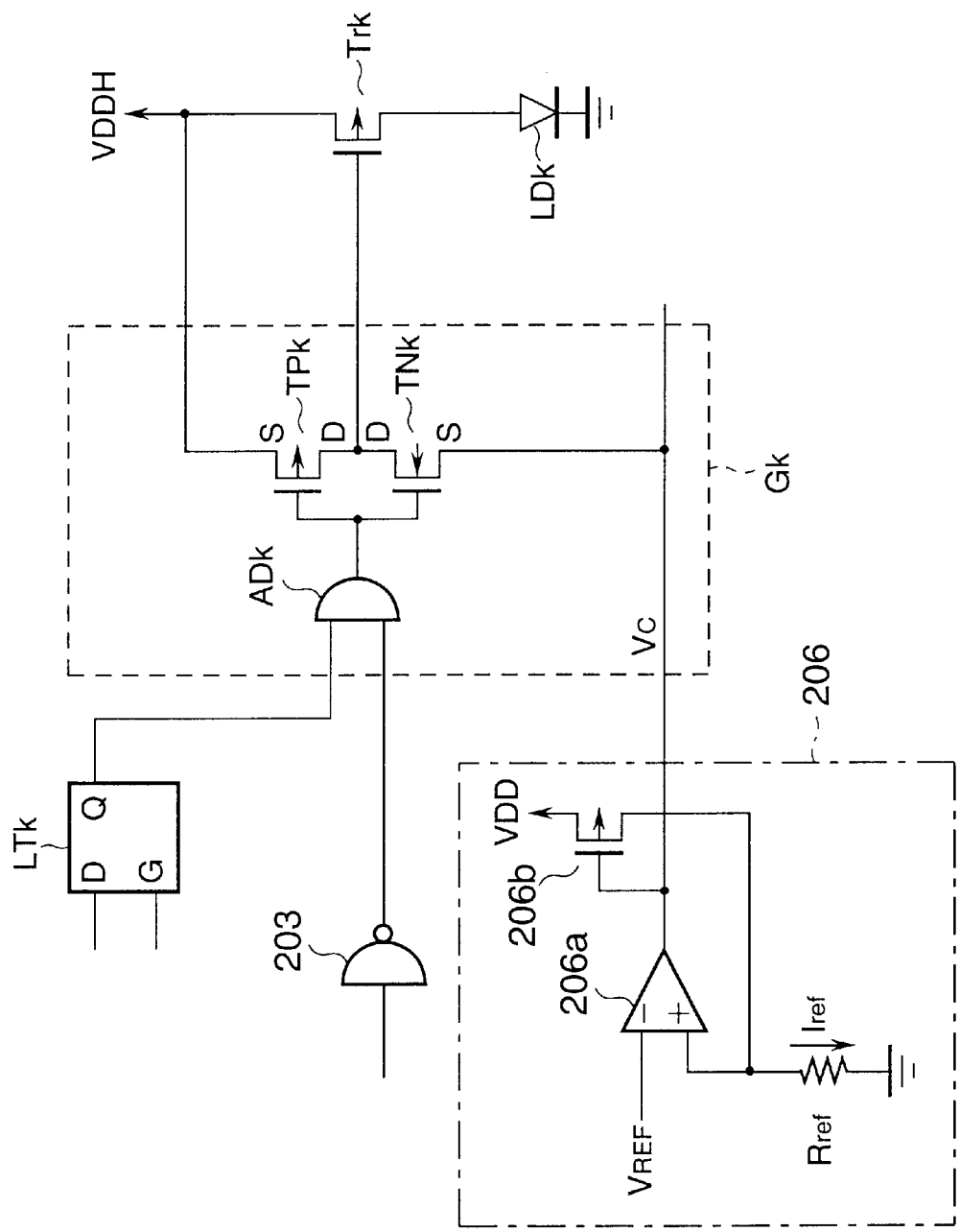
FIG. 3 is a schematic diagram showing the circuit configuration of the k-th pre-buffer Gk and the control voltage generator.

FIG. 3 is a schematic diagram showing the circuit configuration of the k-th pre-buffer Gk and the control voltage generator 206. Referring to FIG. 3, the pre-buffer Gk includes an AND gate ADk, a PMOS transistor TPk, and an NMOS transistor TNk. The control voltage generator 206 includes an operational amplifier 206a, PMOS transistor 206b, and a resistor Rref.

The inverted-input terminal of the operational amplifier 206a receives the reference voltage VREF from the reference voltage generator 300 and the non-inverted input terminal is connected to the drain of the PMOS transistor 206b and is grounded through a resistor Rref. The output terminal of the operational amplifier 206a is connected to the gate terminal of the PMOS transistor 206b and provides a control voltage Vc to the pre-buffer GFk. The source of the PMOS transistor 206b receives a supply voltage VDD. The PMOS transistor 206b is of the same gate length as the drive transistor (PMOS transistor) Trk.

The control voltage generator 206 is a feedback control circuit formed of the operational amplifier 206a, PMOS transistor 206b, and resistor Rref. A current Iref that flows through the resistor Rref and PMOS transistor 206b is not determined by the supply voltage VDD but by the reference voltage VREF and the resistor Rref.

The AND gate ADk receives the output signal of the latch LTk (bit data of the print data HD-DATA) and the output signal of the inverter 203 (inverted strobe signal HD-STB-N). The output of the AND gate ADk is fed to the gates of the PMOS transistor TPk and NMOS transistor TNk. The source of the PMOS transistor TPk receives the drive supply VDDH and the source of the NMOS transistor TNk receives the control voltage Vc. The drains of the PMOS transistor TPk and the NMOS transistor TNk are connected to the gate of the drive transistor Trk.

When the bit data of the print data HD-DATA and the inverted strobe signal HD-STB-N are both high, the pre-buffer Gk applies the control voltage Vc to the gate of the drive transistor Trk. Thus, the control voltage Vc causes the drive transistor Trk to turn on to supply a drive current to the LDk in accordance with the Iref.

Some or all of the LD1–LED4992 of the LED head 19 are driven simultaneously upon strobe signal HD-STB-N. Thus, variations in characteristics of the drive transistors Tr1–Tr4992 and the LED LD1–LD4992 driven by the drive transistors Tr1–Tr4992 cause variations in dot size of the electrostatic latent image formed on the photoconductive drum. Variations in dot size cause variations in print density of a photographic image, impairing print quality.

Figure 4:
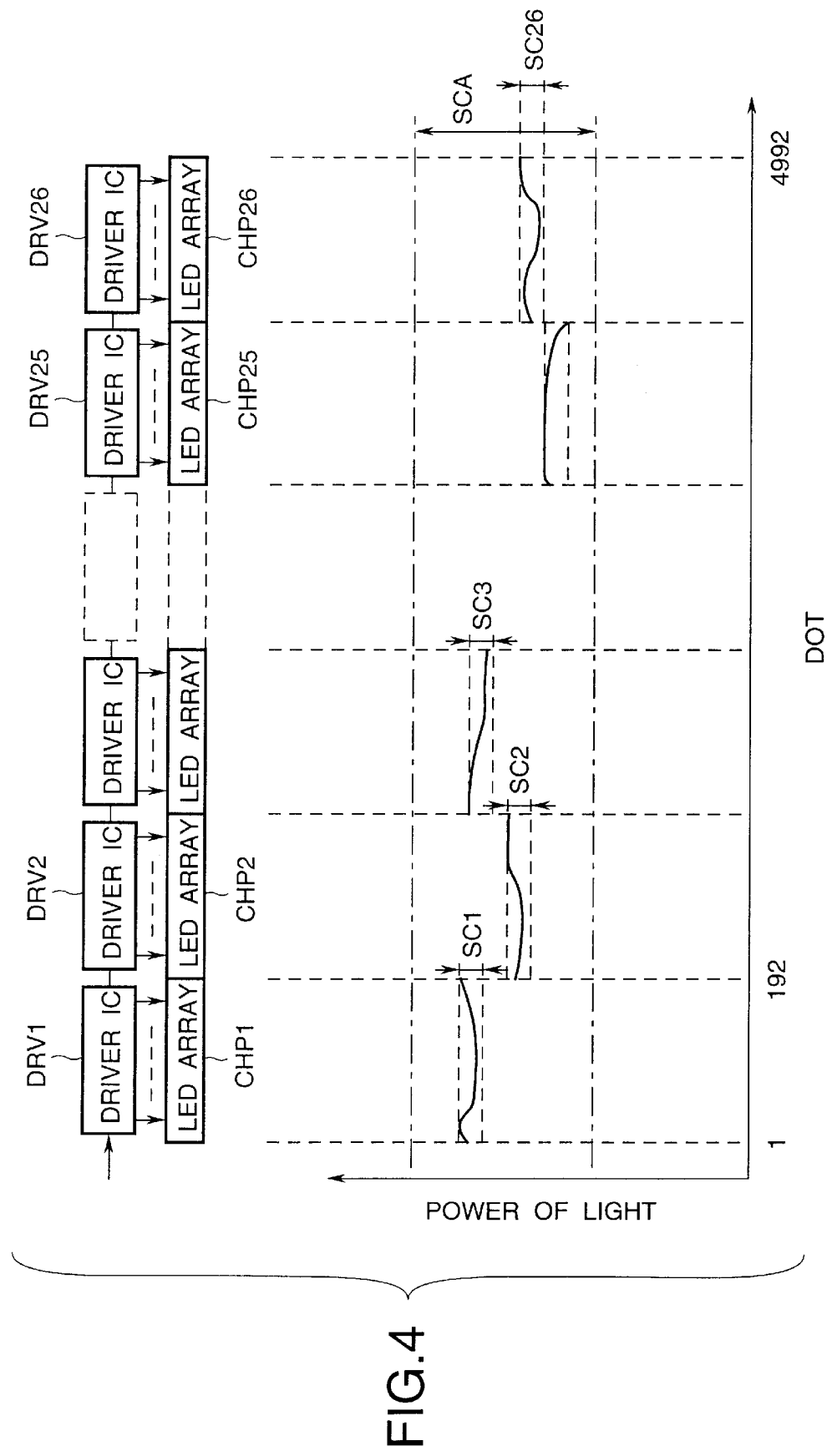
FIG. 4 shows an example of emission of light of the LEDs in the LED head.

FIG. 4 shows an example of emission of light of the LEDs in the LED head 19. Ranges SC1–SC26 are ranges within which light emitted from LEDs in each chipmodule varies in intensity. SCA is a range within which averages of the light emitted from the modules vary.

Figure 5:
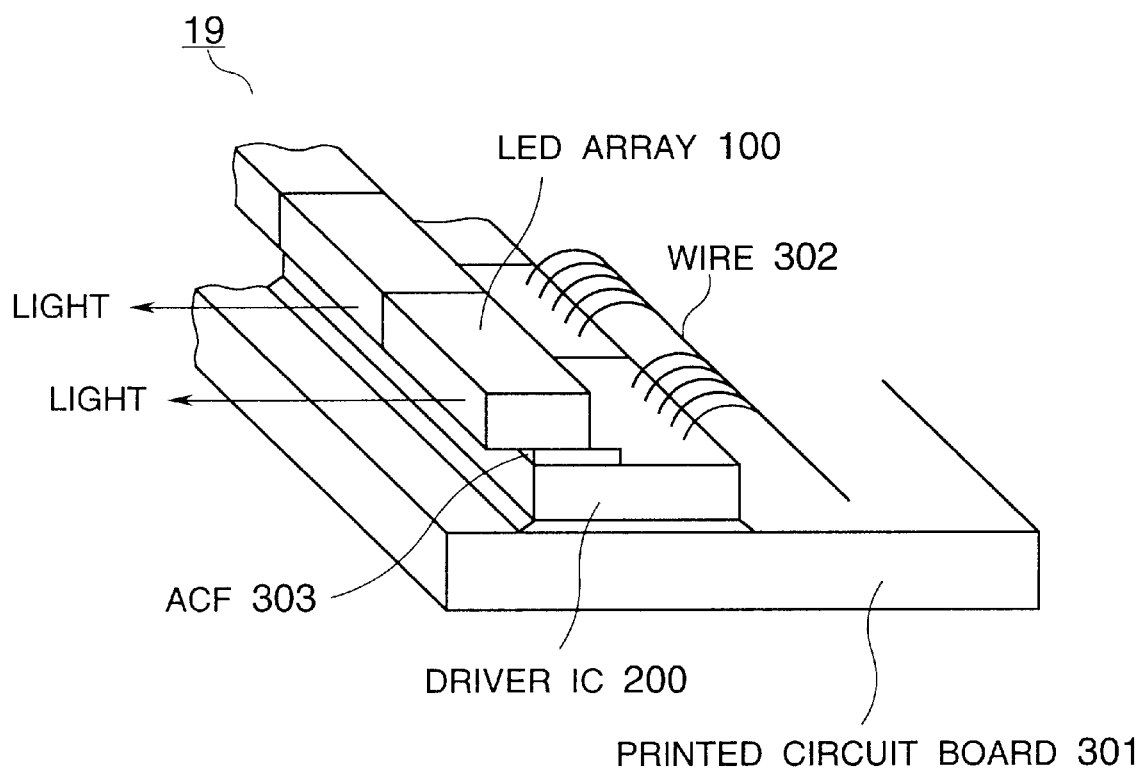
FIG. 5 is a perspective view illustrating the construction of the LED head.

FIG. 5 is a perspective view illustrating the construction of the LED head 19. The LED 19 is of the construction reported in DENSHI JOHO TSUSHINGAKKAI ICD 97-175 (1997-12) and disclosed in Laid-open Japanese Patent No. 8-230229. The chip modules that include the LED array 100 and the LED driver IC 200 are aligned in a line and die-bonded on a print circuit board 301. Then, the input electrode pads and supply electrode pads of the LED driver IC 200 are connected through gold wires 302 to the signal output electrode pads and power-supplying electrode pads formed on the print circuit board 301, respectively.

FIG. 5 shows the LED array 100 of an end surface emitting type LEDs. The aforementioned chip module is a stacked structure of the LED array 100 and the driver IC 200. That is, the anode electrode pads of the LED array 100 are electrically connected to corresponding drive electrode pads of the driver IC 200 through the ACF 303, which is sandwiched between the LED array 100 and the driver IC 200.

First Embodiment

Figure 6:
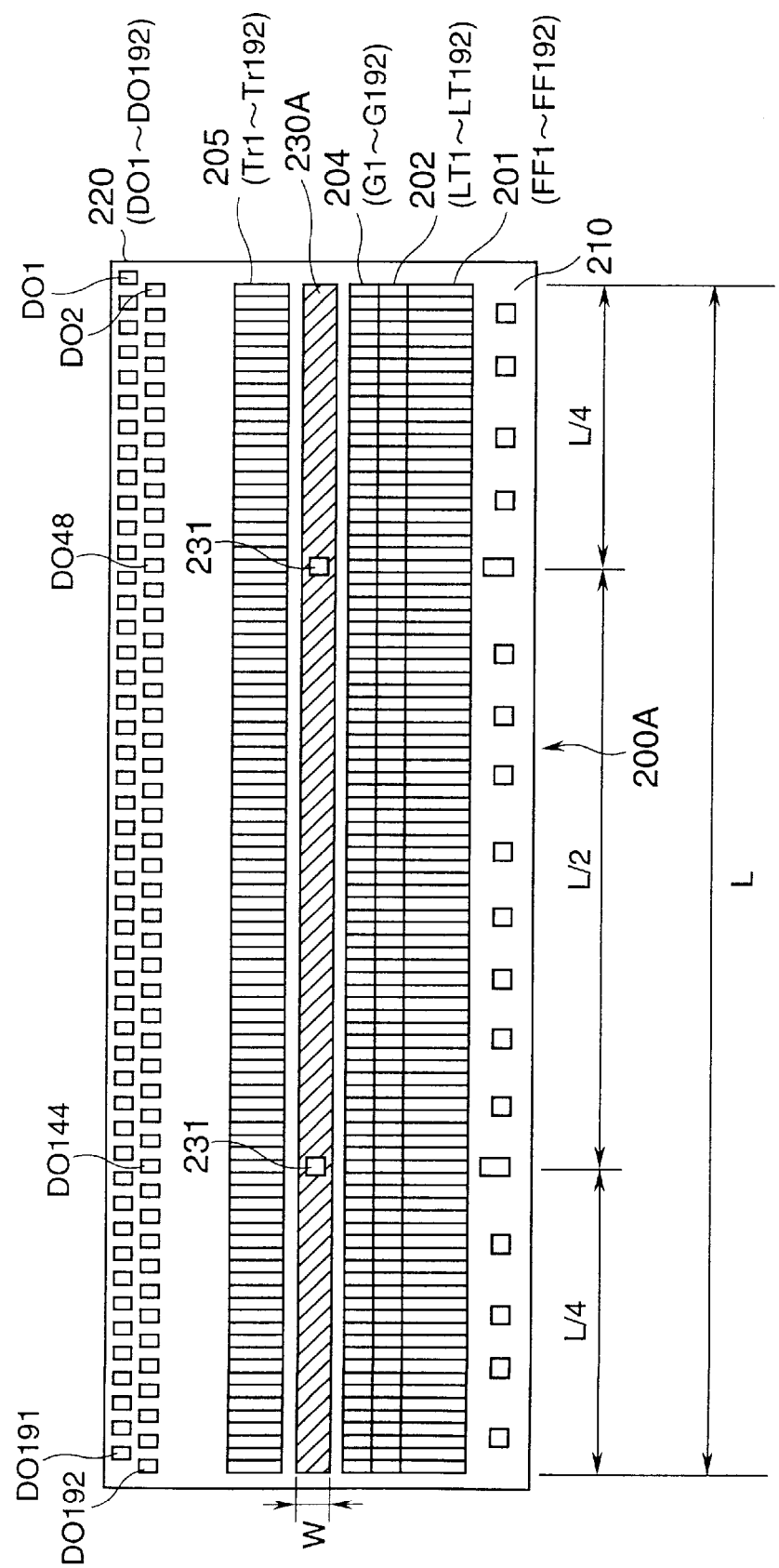
FIG. 6 shows a layout of the driver IC according to a first embodiment of the invention.

FIG. 6 shows a layout of the driver IC 200A according to a first embodiment of the invention. Elements corresponding to those of the conventional driver IC shown in FIG. 17 have been given the same reference numerals.

The LED driver IC 200A is designed to drive 192 LEDs just as the driver IC 200 of FIG. 1. The LED driver IC 200A includes: a shift register 201 having flip-flops FF1–FF192; a set of latches 202 having latches LT1–LT192; a set of pre-buffers 204 having pre-buffers G1–G192, a set of drive transistors 205 having drive transistors Tr1–Tr192; a set of input electrode pads 210, a set of drive electrode pads 220; a supply electrode 230A; and supply electrode pads 231; all of which being fabricated on a single chip. The LED driver IC 200A also includes inverter 203 and control voltage generator 206 (FIG. 1), not explicitly shown in FIG. 6.

The set of drive electrode pads 220 includes drive electrode pads DO1–DO192 (FIG. 2) that drive LEDs LD1–LD192, respectively. The i-th drive electrode pad DOi is connected to the drain of the i-th drive transistor (PMOS transistor) Tri. The set of drive electrode pads 220 are on one of two long sides of the driver IC 200A, being aligned in two rows with one row staggered with respect to the other.

The input electrode pads 210 include input electrode pads that receive the print data HD-DATA, clock signal HD-CLK, latch signal HD-LOAD, and strobe signal HD-STB-N. The input electrode pads 210 are aligned in a row along the long side of the driver IC 200A, remote from the set of drive electrode pads 220 with respect to the supply electrode 230A.

The flip-flops FF1–FF192, latches LT1–LT192, pre-buffers G1–G192, and drive transistors 205 are all aligned in the direction of long sides of the driver IC 200A and are at substantially the same intervals as the drive electrode pads 220 as shown in FIG. 6. The shift register 201, set of latches 202, set of pre-buffers 204, and set of drive transistors 205 are arranged in this order from the input electrode pad 210 side.

The supply electrode 230A is an aluminum electrode having a width of W and is located between the set of drive transistors 205 and the set of pre-buffers 204. The supply electrode 230A extends along the set of drive transistors 205 (i.e., the row of Tr1–Tr192) between the short sides of the driver IC 200A, and distributes electric power to the set of drive transistors.

The supply electrode 230A has a plurality of supply electrode pads 231 thereon through which the drive supply VDDH is supplied from outside (FIG. 6 shows only two pads 231 by way of example). The source terminals of the drive transistors Tr1–Tr192 are connected to nearby supply electrode 230A.

The two supply electrode pads 231 are located at locations that correspond to drive transistors Tr48 and Tr144 (drive pads DO48 and DO144). In other words, the supply electrode pads 231 divide the entire length L of the supply electrode 230A of the driver IC 200A into L/4, L/2, and L/4. This division ratio is the feature of the first embodiment.

Figure 7:
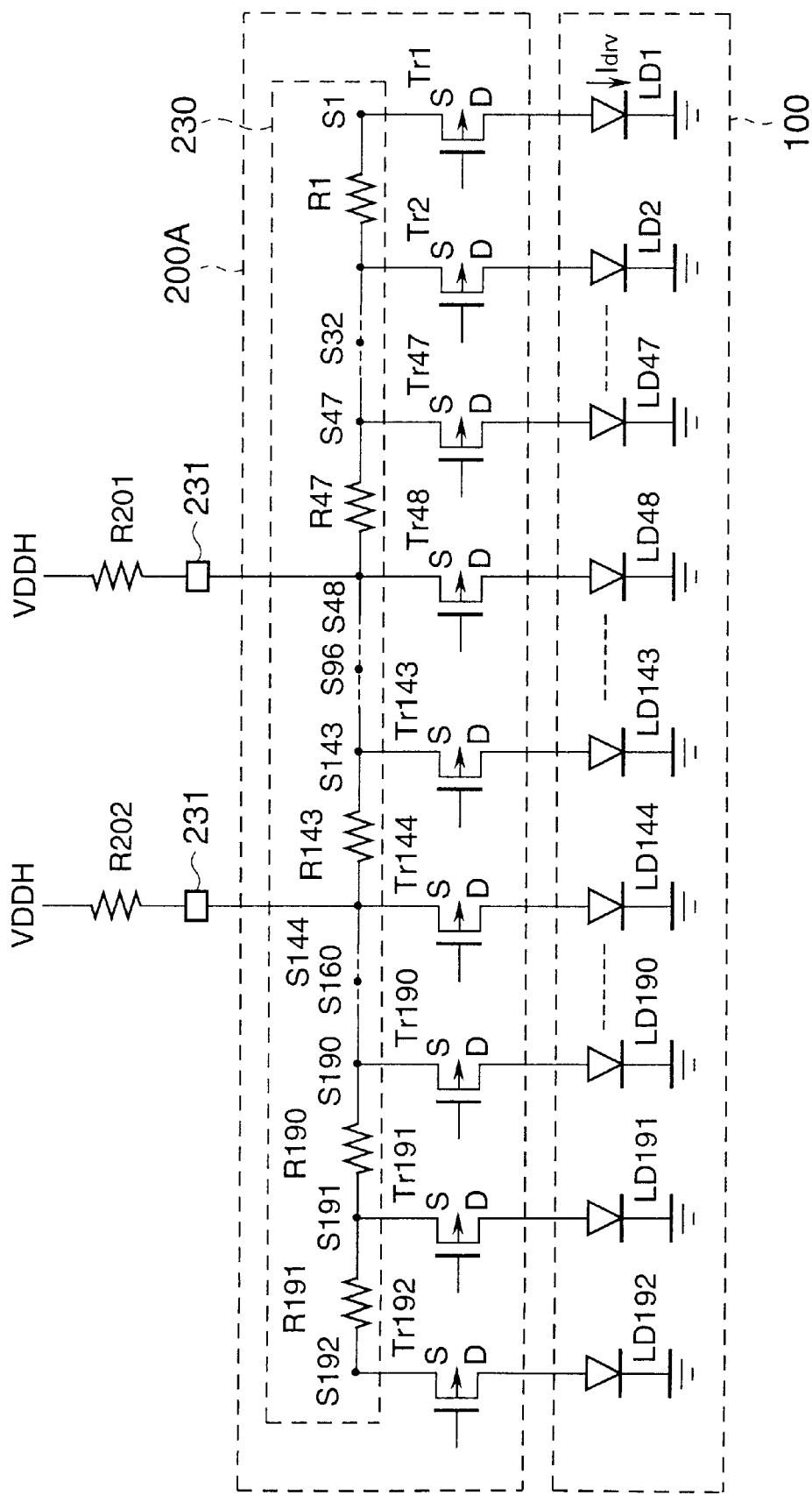
FIG. 7 is a partial electrical equivalent circuit of the LED array and the driver IC of the first embodiment.

FIG. 7 is a partial electrical equivalent circuit of the LED array 100 and the driver IC 200A.

Referring to FIG. 7, resistors R201 and R202 are model representations of internal resistance of the Au wires that are bonded to the supply electrode pads 231. The supply electrode pads receive drive supply VDDH. The sources of the drive transistors Tr1–Tr192 are connected at nodes S1–S192 to the supply electrode 230A.

Resistors R1–R191 are model representations of the resistance between adjacent nodes of the supply electrode 230A. The i-th resistor Ri ("i" is an integer from 1 to 192) can be computed as follows:

When W is 200 µm, the sheet resistance R☐ is $30 \times 10^{-3}$ Ω, and the LEDs are arranged at intervals equivalent to 600 dpi, the drive transistor Tr1–Tr192 are also arranged at intervals equivalent to 600 dpi. Thus, the Tr1–Tr192 are arranged at intervals L given by L=25.4 mm/600=42.3 µm. Thus, the model resistance is given by:

$$R\square \times (L/W) = 30 \times 10^{-3} \times (42.3 \times 10^{-6}/200 \times 10^{-6}) = 6.4 \text{ m}\Omega.$$

The gate terminal of the i-th drive transistor (PMOS transistor) of Tri ("i" is an integer from 1 to 192) is connected to the i-th pre-buffer Gi (FIGS. 6 and 3). The drain of the i-th drive transistor Tri is connected to the i-th drive electrode pad DOi through the ACF connection. When the i-th drive transistor Tri receives the control voltage Vc from the pre-buffer Gi, the drive transistor Tri supplies a drive current Id to the i-th LED LDi in accordance with the control voltage Vc and the potential of the source (i.e., i-th node Si).

Since the supply electrode pads 231 are located near the drive transistors Tr48 and Tr144 (i.e., drive electrode pads DO48 and DO144), the model representations of the wire resistance R201 and R202 are connected to the nodes S48 and S144 (i.e., the sources of the drive transistors Tr48 and Tr144) respectively.

Referring to FIG. 7, when all of the LEDs (i.e., all the dots) of the LED array 100 are simultaneously energized, the drive current is supplied through the resistors R201 and 202 via the nodes S48 and S144 to the drive transistors Tr1–Tr192. Then, for example, the i-th drive transistor Tri supplies the drive current to i-th LED LDi. It is to be noted that the number N of drive transistors Tr1–Tr192 is divided into N/4, N/2, and N/4 for L/4, L/2, and L/2 of the length L of the supply electrode 230A, respectively, along the supply electrode 230A.

Figure 8:
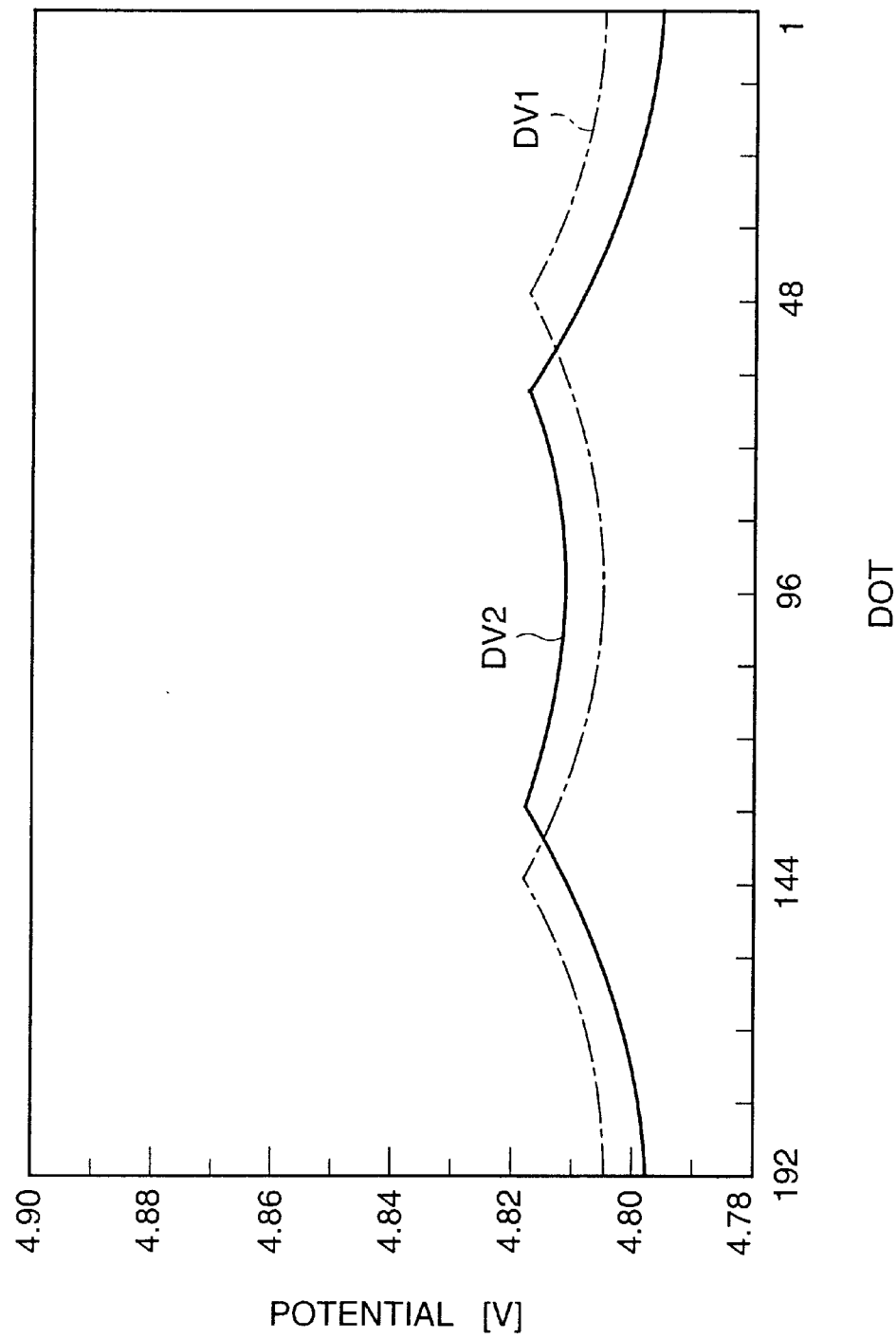
FIG. 8 illustrates potentials along the supply electrode of the first embodiment and the prior art when all of the LEDs are simultaneously energized.

FIG. 8 illustrates potential distribution along the supply electrode 230A when all of the LEDs of the first embodiment (Curve DV1) and prior art chip module (Curve DV2) are simultaneously energized.

Figure 9:
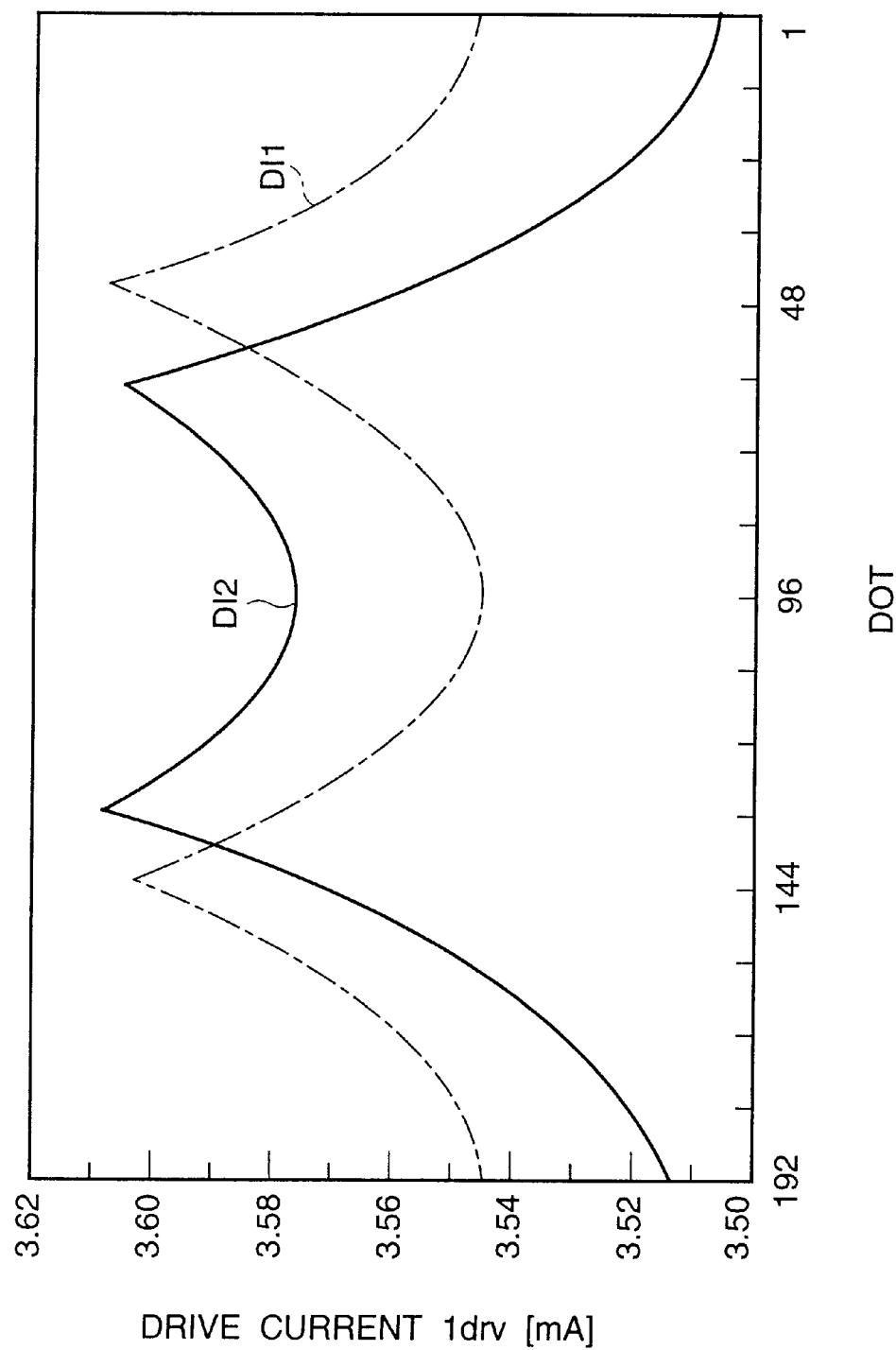
FIG. 9 illustrates the drive currents of the respective LEDs when all of the LEDs of the first embodiment and prior art chip module are simultaneously energized.

FIG. 9 illustrates the drive currents of the respective LEDs when all of the LEDs of the first embodiment (Curve DI1) and prior art chip module (Curve DI2) are simultaneously energized.

Since the supply electrode pads 231 (FIG. 6) are located at the nodes S48 and S144, the resistors R1–R192 cause voltage drops such that the potential is the highest at the nodes S48 and S144 and decreases with increasing distance from the nodes S48 and S144. The current density and potential rapidly change near the nodes S48 and S144 and more gradually change with increasing distance from the nodes S48 and S144.

As shown in FIG. 9, the LEDs LD48 and LD144 that correspond to the nodes S48 and S144 (corresponding to drive transistors Tr48 and Tr144 and drive electrode pads DO48 and DO144) draw the largest drive currents and other LEDs draw progressively less current with decreasing distance from the LEDs LD48 and LD144.

Due to the fact that the supply electrode pads 231 are positioned such that the total length L of the supply electrode 230A is divided into L/4, L/2, and L/4, the potentials at endmost nodes S1 and S192 and the potential at the node S96 (substantially midpoint of the total length of the supply electrode 230A) are substantially the same as shown in FIG. 8. Thus, as shown in FIG. 9, the drive currents through the drive electrode pads DO1 and DO192 are substantially the same as that through the drive electrode pads DO96 where the drive current becomes a local minimum.

The range in which potentials are distributed progressively widens as the distance between a node of the highest potential and a node of the lowest potential increases. The nodes of the highest potential and lowest potential correspond to the nodes of the largest drive current and lowest drive current, respectively. Accordingly, the variation of drive current increases with increasing distance between a drive electrode pad of the largest drive current and a drive electrode pad of the smallest drive current. The variations of potential and drive current becomes a minimum, when the distribution of potential is such that the potentials at nodes corresponding to endmost portions of the supply electrode 230A become equal to those at a node having a maximum potential variation.

When two supply electrode pads 231 are to be provided on the supply electrode 230A, if the supply electrode pads 231 are positioned such that the total length L of the supply electrode 230A is divided into L/4, L/2, and L/4, then the potential difference between a node having a maximum potential (noes S48, S144) and nodes having a minimum potential (node S1, S96, S192) can be minimized. This fact allows minimizing the variations in the potential distribution along the supply electrode 230A and variations in the drive current supplied through the drive electrode pads 220 to the LEDs of the LED array 100.

When three supply electrode pads 231 are to be provided on the supply electrode 230A, the supply electrode pads 231 are positioned such that the total length L of the supply electrode 230A is divided into L/6, L/3, L/3, and L/6. In other words, the supply electrode pads 231 are positioned at node S32, S96, S160 shown in FIG. 7 and the drive supply VDDH is fed through resistors equal to R201 and R202.

Figure 10:
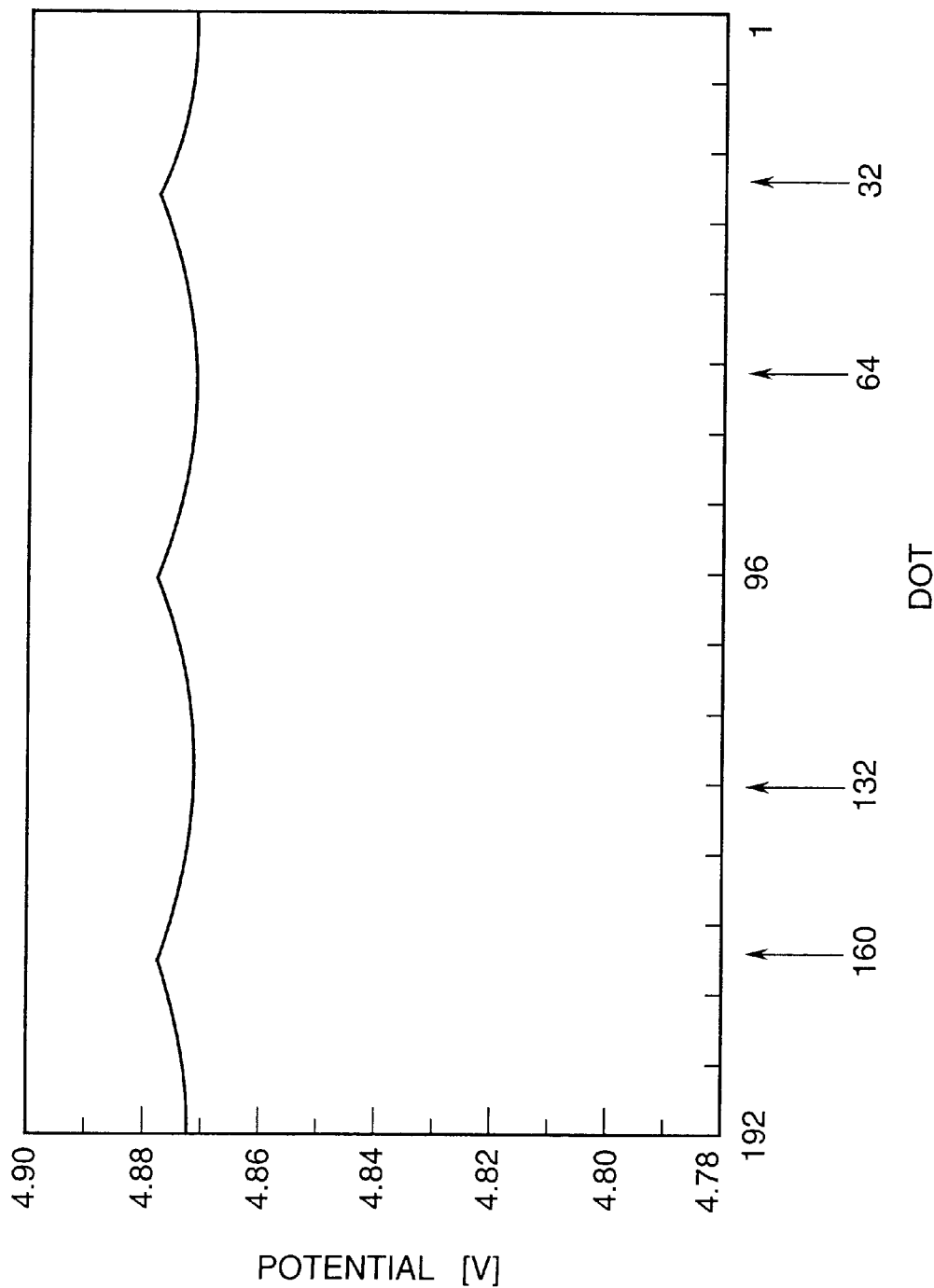
FIG. 10 illustrates the distribution of potential along the supply electrode when all of the LEDs of a chip module according to the first embodiment are energized simultaneously, the supply electrode having three supply electrode pads.

FIG. 10 illustrates the distribution of potential along the supply electrode 230A when all of the LEDs of a chip module with three supply electrode pads 231 are energized.

Figure 11:
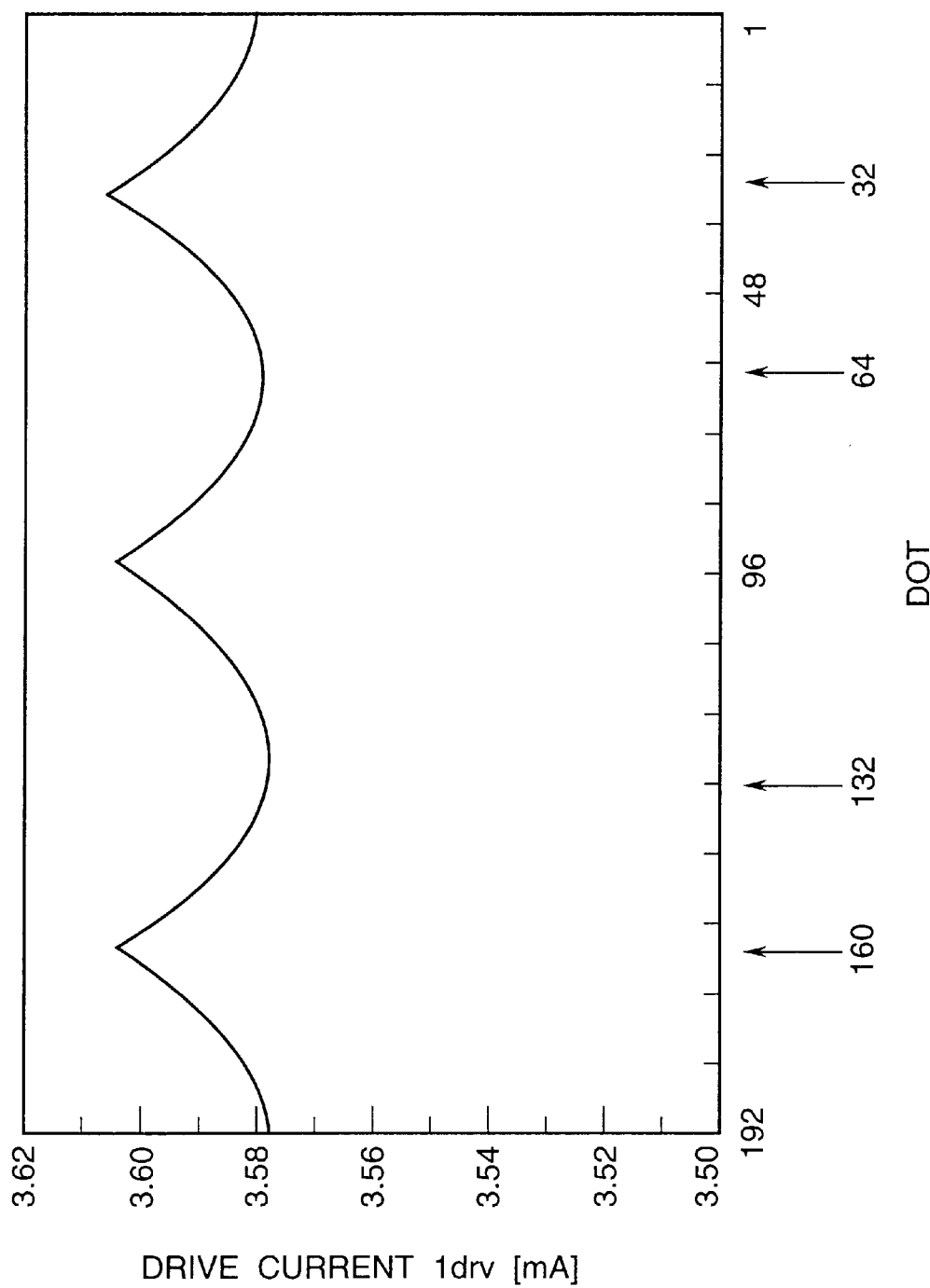
FIG. 11 illustrates the drive currents through the LEDs when all of the LEDs of a chip module according to the first embodiment are simultaneously energized, the supply electrode having three supply electrode pads.

FIG. 11 illustrates the drive currents through the LEDs when all of the LEDs of a chip module with three supply electrode pads 231 are energized.

When three supply electrode pads 231 are provided in the aforementioned manner, as shown in FIG. 10, the potentials at nodes S1 and S192 corresponding to the endmost portions of the supply electrode 230A are equal to the potentials at nodes S64 and S132 where potentials are locally minimum. Moreover, as shown in FIG. 11, the drive currents through the drive electrode pads DO1 and DO192 are substantially equal to the drive currents through the drive electrode pads DO64 and DO132 where drive currents are local minimums. Thus, the larger the number of supply electrode pads is, the smaller the variations in potential and drive current are.

When N supply electrode pads 231 are to be provided in the aforementioned manner (N is an integer not smaller than 2), the n-th supply electrode pad is placed at a distance given by L(2n−1)/2N from one end of the supply electrode 230A, where n is an integer from 1 to N and L is the total length of the supply electrode 230A. In other words, the supply electrode pads 231 are positioned such that one of the supply electrode pads 231 corresponds to the n-th drive transistor Tn. The position of the n-th drive transistor Tn is given by (2n−1)/2N from one end of the row of the drive transistors where N is a total number of drive transistors and n is an integer from 1 to N.

Second Embodiment

Figure 12:
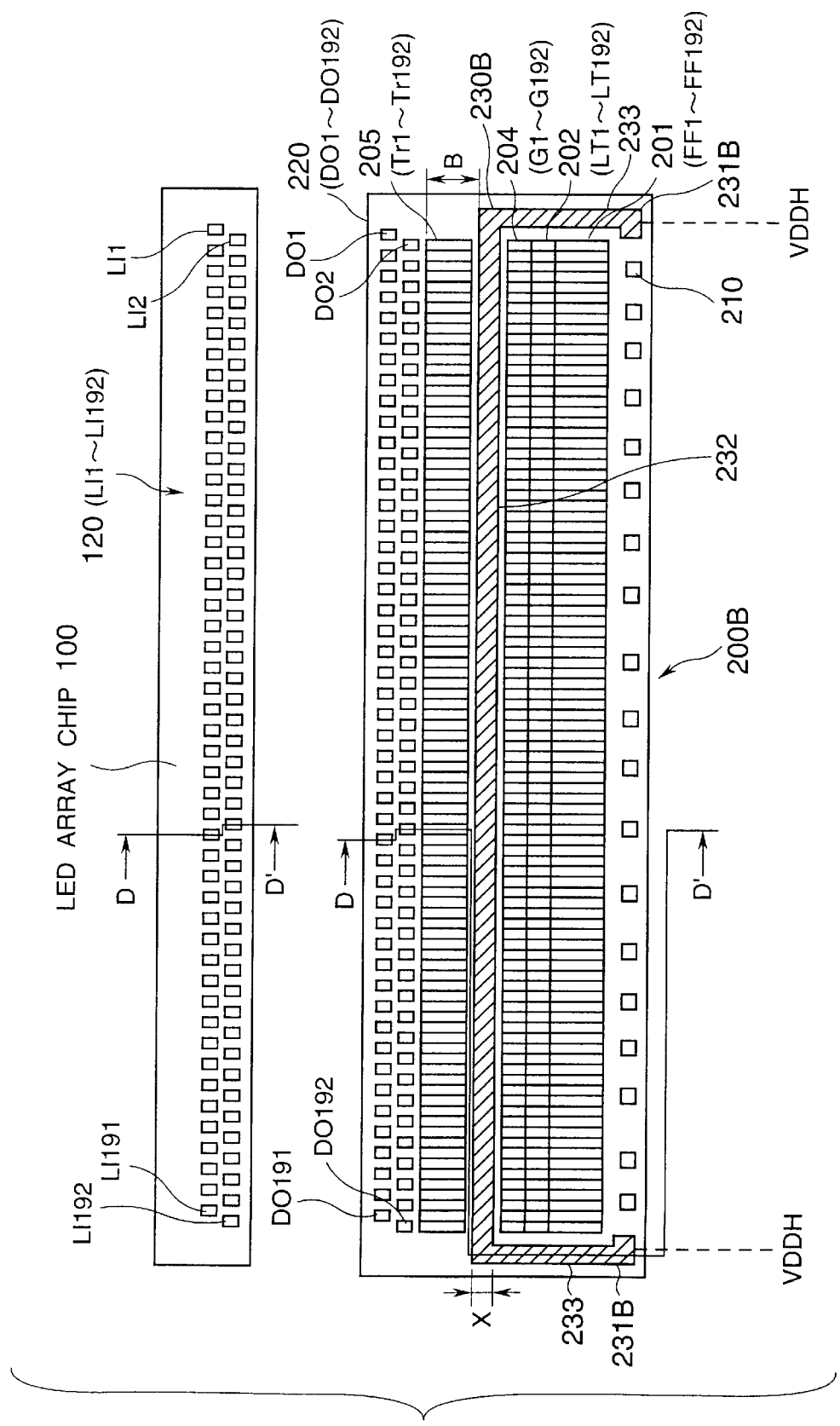
FIG. 12 illustrates a layout of a driver IC according to a second embodiment.

FIG. 12 illustrates a layout of a driver IC 200B according to a second embodiment.

Elements similar to those in the first embodiment shown in FIG. 6 have been given the same reference numerals.

The driver IC 200B differs from the driver IC 200A of the first embodiment in that a supply electrode 230B is used in place of the supply electrode 230A, a supply electrode pad 231B is used in place of the supply electrode pad 231, and the unused area in the region A between the set of the drive electrode pads 220 and the set of the drive transistors 205 has been eliminated.

The set of the drive transistors 205 is aligned along the set of the drive electrode pads 220 which in turn are aligned along the one of two long sides of the driver IC 400. The supply electrode 230B extends along the set of drive electrode pads 220. A region B shown in FIG. 12 is the region from even-numbered drive electrode pads (DO2, DO4, . . . , DO192) to the supply electrode 230B, and corresponds to the region A shown in FIG. 17. There is no unused area in region B and therefore B>A.

The supply electrode 230B is of a generally U-shape which has a supply-distributing section 232 that extends along the set of drive transistors 205 and pad-connecting sections 233. In other words, the supply electrode 230B extends along the set of the drive transistors 205 to the opposing short sides of the drive IC 200B, and then extends in directions perpendicular to the row of the set of the drive transistors 205. The free ends of the supply electrode 230B extend to locations next to endmost pads of a row of input electrode pads 210.

There are provided supply electrode pads 231B at areas next to the endmost pads of the row of input electrode pads 210, and the drive supply VDDH is supplied from outside through the supply electrode pads 231B. The supply electrode pads 231B are free end portions of supply electrode 230B and provide for wire bonding.

Figure 17:
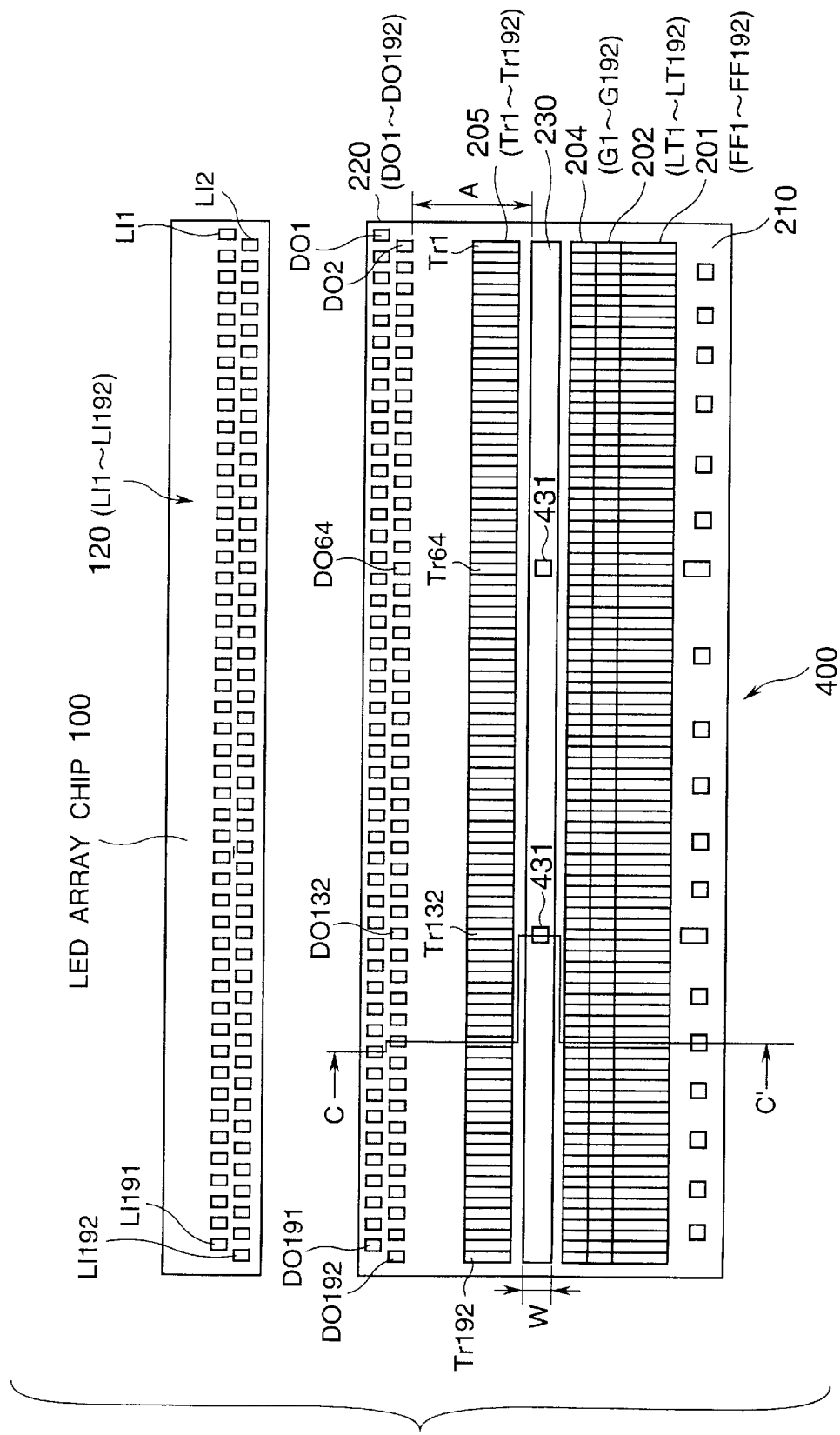
FIG. 17 illustrates a layout of a prior art driver IC fabricated using the technique disclosed in Japanese Patent Preliminary Publication (KOKAI) No. 6-297765.

The supply distributing section 232 has a width X which correspond to the width W of the supply electrode 230A shown in FIG. 17. Since no supply electrode pad is provided on the supply electrode 230B, X is smaller than W.

Figure 13:
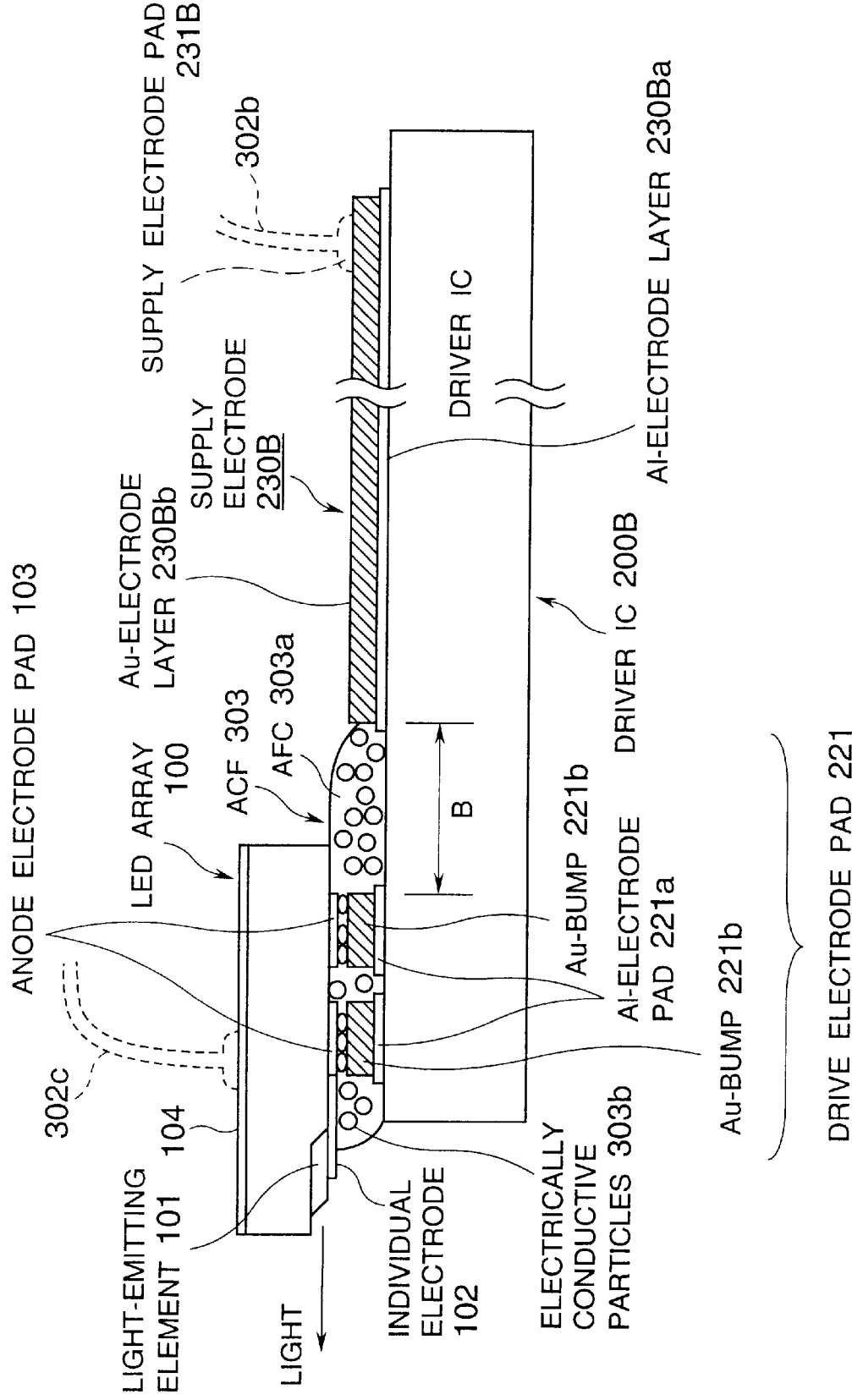
FIG. 13 is a cross-sectional view of a chip module according to the second embodiment, the chip module including the LED array and LED driver IC electrically connected through the ACF to the LED array.

FIG. 13 is a cross-sectional view of a chip module, which includes the LED array 100 and LED driver IC 200B electrically connected through the ACF to the LED array 100. FIG. 13 corresponds to the cross-section taken along lines D–D'. elements similar to those shown in FIG. 18 have been given the same reference numerals.

The supply electrode 230B includes an Al electrode layer 230Ba formed on an Au electrode layer 230Bb. The Al electrode layer 230Ba is formed, for example, in the same process as the electrode 230 shown in FIG. 18. The Au electrode layer 230Bb is formed in the same process as the Au bumps 211b and 221b are formed, and formed as thick as the Au bumps 211b and 221b are high. The Au electrode layer 230Bb and the Al electrode layer 230Ba are of the laminated construction with no gap therebetween such that a maximum contact area and a minimum contact resistance are achieved.

The supply electrode pad 231B is a part of the supply electrode 230B and therefore is of the same construction as the supply electrode 230A, i.e., Au electrode layer is formed on the Al electrode layer.

Figure 18:
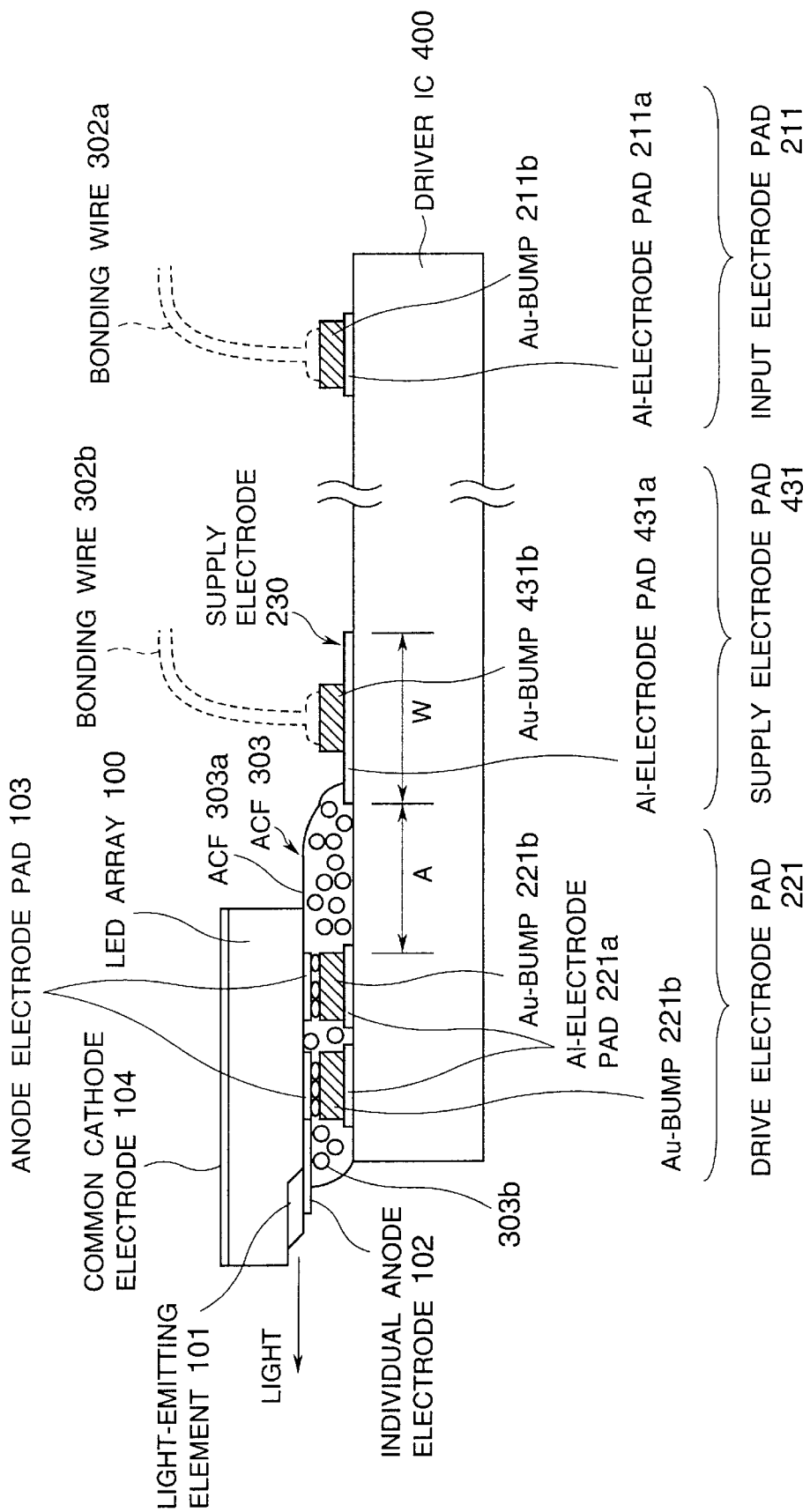
FIG. 18 is a lateral cross-sectional view of a prior art chip module having the LED array and prior art driver IC, taken along lines C–C' of FIG. 17.
Figure 19:
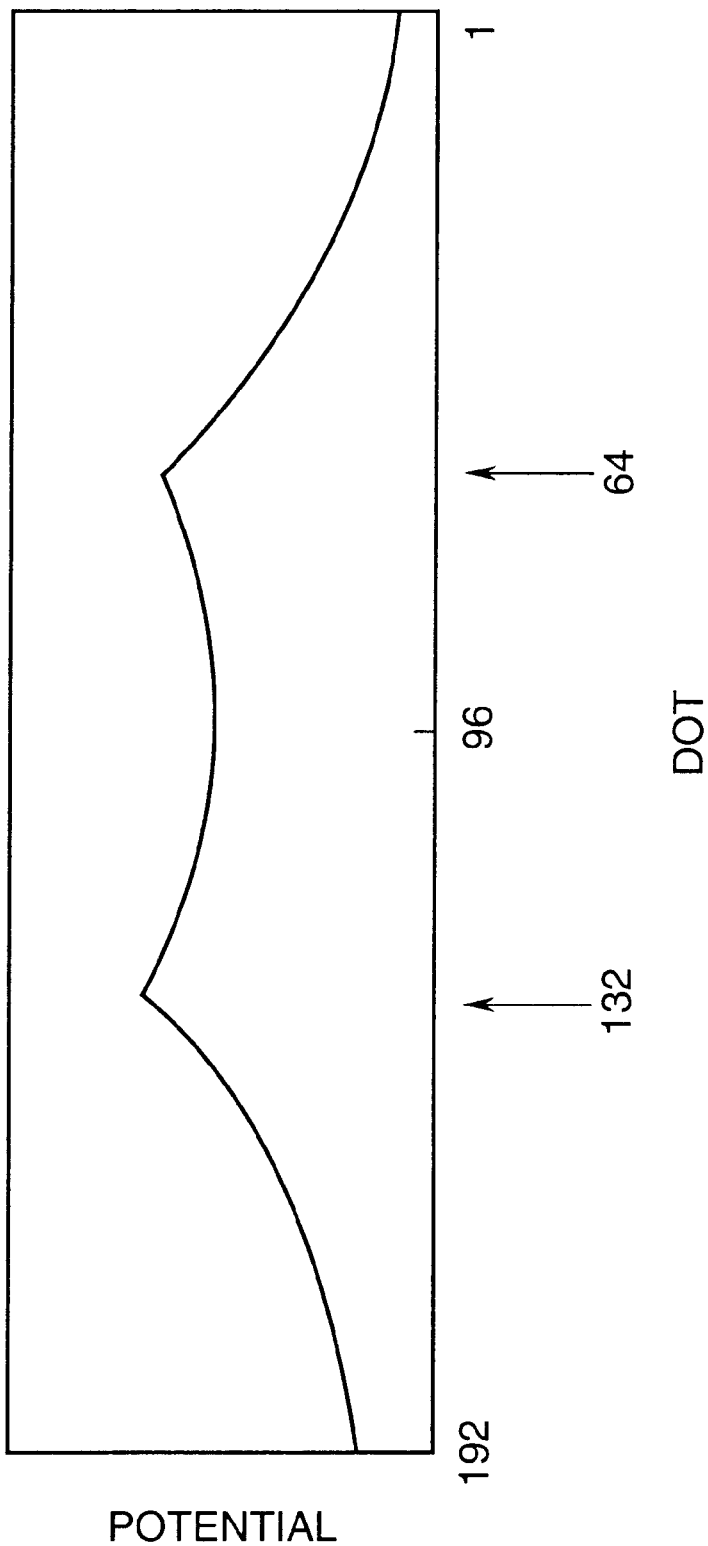
FIG. 19 illustrates the distribution of potential along the supply electrode of the first embodiment when all the LEDs are energized simultaneously.

In the same manner as described with reference to FIG. 18, the LED array 100 and driver IC 400 are electrically connected through an ACF 303 into a chip module as shown in FIG. 13. The ACF 303 includes a thermosetting ACF resin 303a having electrically conductive particles 303b dispersed therein.

After the chip module is die-bonded to a printed circuit board 301 (FIG. 5) to build the LED head 19, the supply electrode pad 231B is connected through a bonding wire (gold wire) 302 to the supply electrode pad 231B.

The height of the Au bump 211b is selected to be about 15 μm in order that only the 5 μm-diameter conductive particles 303b make a conducting path between the anode electrode pad 103 and the Au bump 221b. Thus, the thickness of the Au electrode layer 230Bb of the supply electrode 230B is about 15 μm.

The supply electrode 230 of the prior art driver IC 400 shown in FIG. 17 is an Al electrode. The sheet resistance of Al electrode is about 30 mΩ. Thus, the width W of the supply electrode 230 is selected to be about 200 μm such that resistors R1–R192 are of minimum values.

In contrast to this, the driver IC 200B of the second embodiment is characterized in that the supply electrode 230B has the Au electrode layer 230Bb. The Au electrode layer 230b has a resistivity lower than Al electrode, and can be formed in the same process as Au bumps, so that the Au electrode layer 230Bb is thicker than Al electrode. In other words, providing Au electrode layer 230Bb as a part of the supply electrode 230B allows the sheet resistance of supply electrode 230B to be smaller than that of the prior art supply electrode 230 in the form of Al electrode.

A sample computation of the sheet resistance of the Au electrode layer 230Bb is as follows: The volume resistivity ρ of Au is given by $\rho=2.26\times10^{-8}$ Ωm. Thus, the sheet resistance $R\square=2.26\times10^{-8}/15\times10^{-6}=1.51\times10^{-3}$ Ω/□, which is about 1/20 of that of the Al electrode.

The electrode 230B has a smaller sheet resistance than the prior art electrode 230, so that the variation in the potential along the supply electrode is smaller than that of the prior art and therefore the variation in drive current is decreased.

The sheet resistance of the supply electrode 230B smaller than that of the prior art allows the supply electrode pads 231B to be positioned at the free end portions of the pad-connecting sections 233, not on the supply-distributing section 232 that extends along the set of drive transistors 205. The width X of the supply-distributing section 232 can be made narrower than that W of the prior art electrode 230, because the supply electrode pads 231B need not be formed on the supply-distributing section 232 and the sheet resistance of the supply-distributing section 232 is lower than that of the prior art. For example, the width X can be 1/20 of the width W for the same resistance. Thus, the chip size can be smaller.

The supply electrode pads 231B are not formed on the supply-distributing section 232 that runs along the set of drive transistors 205. Thus, even if the excessive ACF resin that spreads out of the array-mounted region covers the supply-distributing section 232, the excessive ACF resin does not cause a problem of obstructing wire bonding process as in the prior art. Therefore, there is no need for providing an unused area between the set of drive electrode pads 220 and the set of drive transistors 205. As a result, the region B can be smaller than the region A of the prior art, allowing smaller chip size.

Moreover, the thick Au electrode layer 230B serves as a bank that stops the ACF 303 spreading out from the array-mounted region, preventing the number of conductive particles sandwiched between the anode electrode 103 and the Au bump 221b from decreasing. This prevents the abnormal increases in the resistance between the anode electrode 103 and the Au bump 221b.

The supply electrode 230B may not include the pad connecting sections 233. In other words, the Au electrode layer may be provided only on the Al electrode layer that extends along the set of drive transistors 205 to the opposing two short sides of the rectangular shape. However, if the pad-connecting sections 233 are not included, the supply electrode pads need be formed on the supply distributing section 232. Therefore, it is required that the width X shown in FIG. 12 is as large as the width W and the region B is equal to region A.

Third Embodiment

Figure 14:
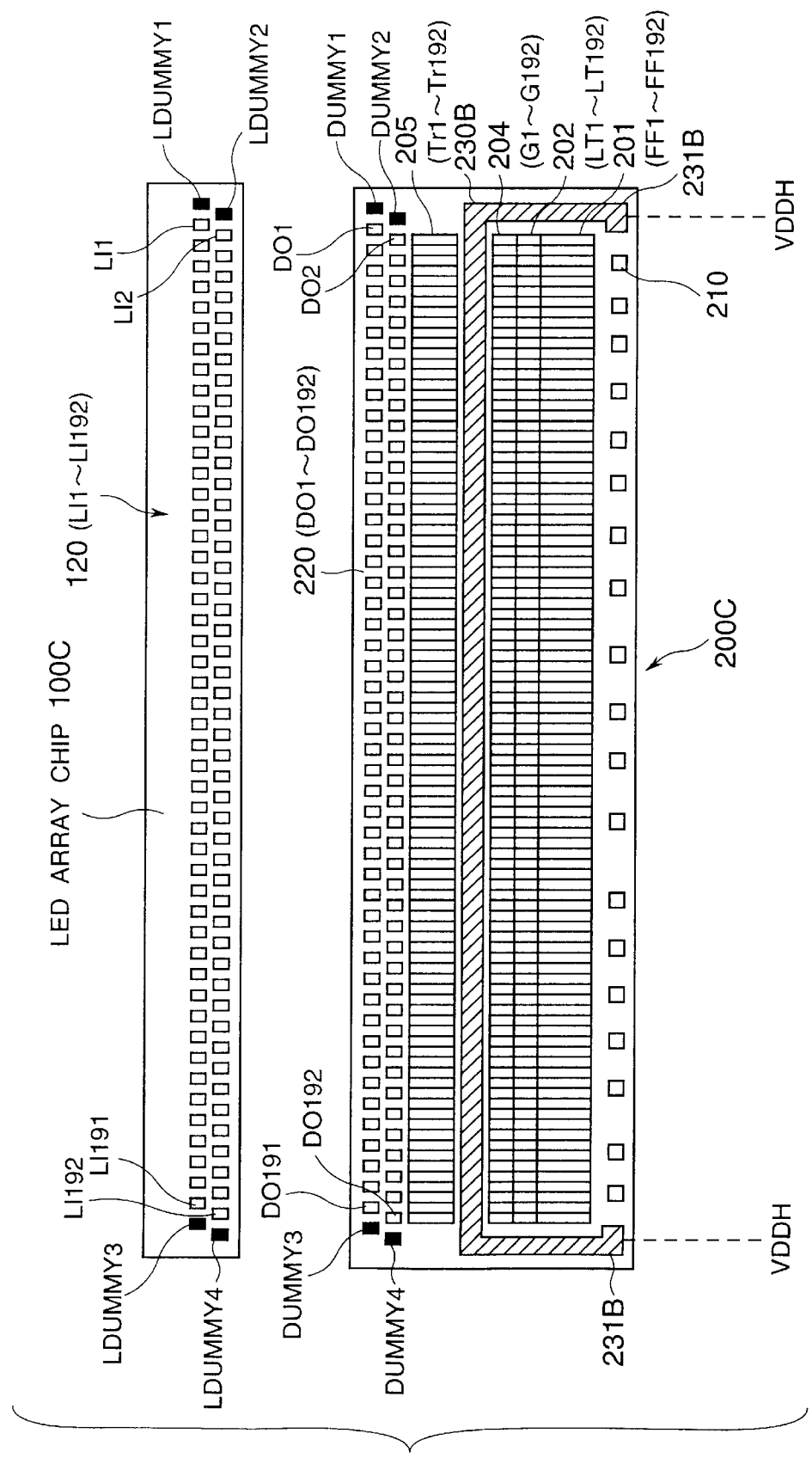
FIG. 14 illustrates a layout of a driver according to a third embodiment.

FIG. 14 illustrates a layout of a driver IC 200C according to a third embodiment.

FIG. 14 also shows a layout of the LED array 100C that is connected through an ACF to the driver IC 200C. It is to be noted that the LED array 100C is shown as a "see-through" view. Elements similar to those of FIG. 12 have been given the same reference numerals.

The driver IC 200C differs from the driver IC 200B of FIG. 12 in that the dummy electrode pads DUMMY 1–DUMMY 4 are provided outside of the row of the drive electrode pads DO1–DO192 and adjacent to the endmost pads DO1, D02, DO191, and DO192.

The dummy electrode pads DUMMY 1–DUMMY 4 are of the same size and construction as the drive electrode pads DO1–DO192, and are aligned at the same intervals as the drive electrode pads DO1–DO192. In other words, the DUMMY 1–DUMMY 4 are of the construction in which Au bumps are provided on the Al electrode of the drive electrode pads 221 shown in FIG. 13.

The LED array 100C differs from the LED array 100 of FIG. 17 in that dummy driven electrode pads LDUMMY 1–LDUMMY 4 are located outside of the row of the anode electrode pads, arranged at the same intervals as LI1–LI191 adjacent to endmost pads LI1, LI2, LI191, and LI192.

The dummy driven electrode pads LDUMMY 1–LDUMMY 4 are of the same size and construction as the anode electrode pads LI1–LI192, and are aligned with the DUMMY 1–DUMMY 4.

Figure 15:
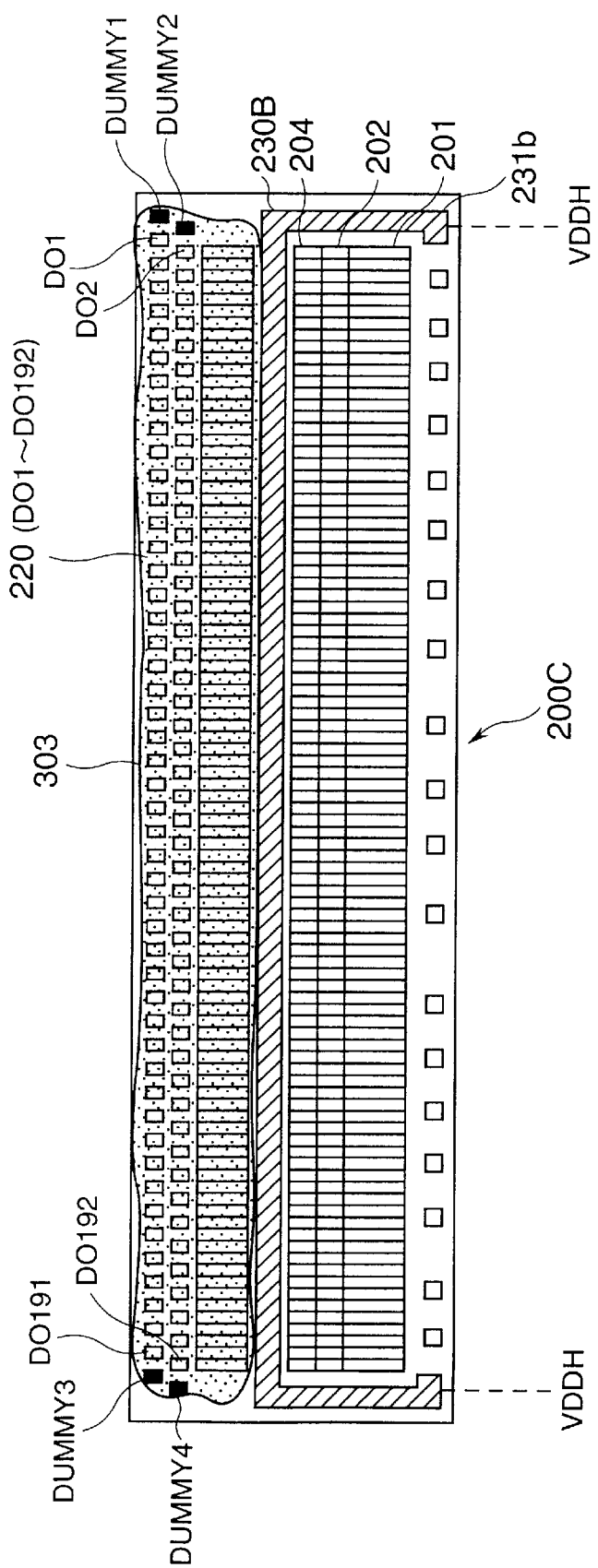
FIG. 15 is similar to FIG. 24 and illustrates the ACF that spreads over the driver IC when the LED array is electrically connected to the driver IC through the ACF sandwiched therebetween.
Figure 20:
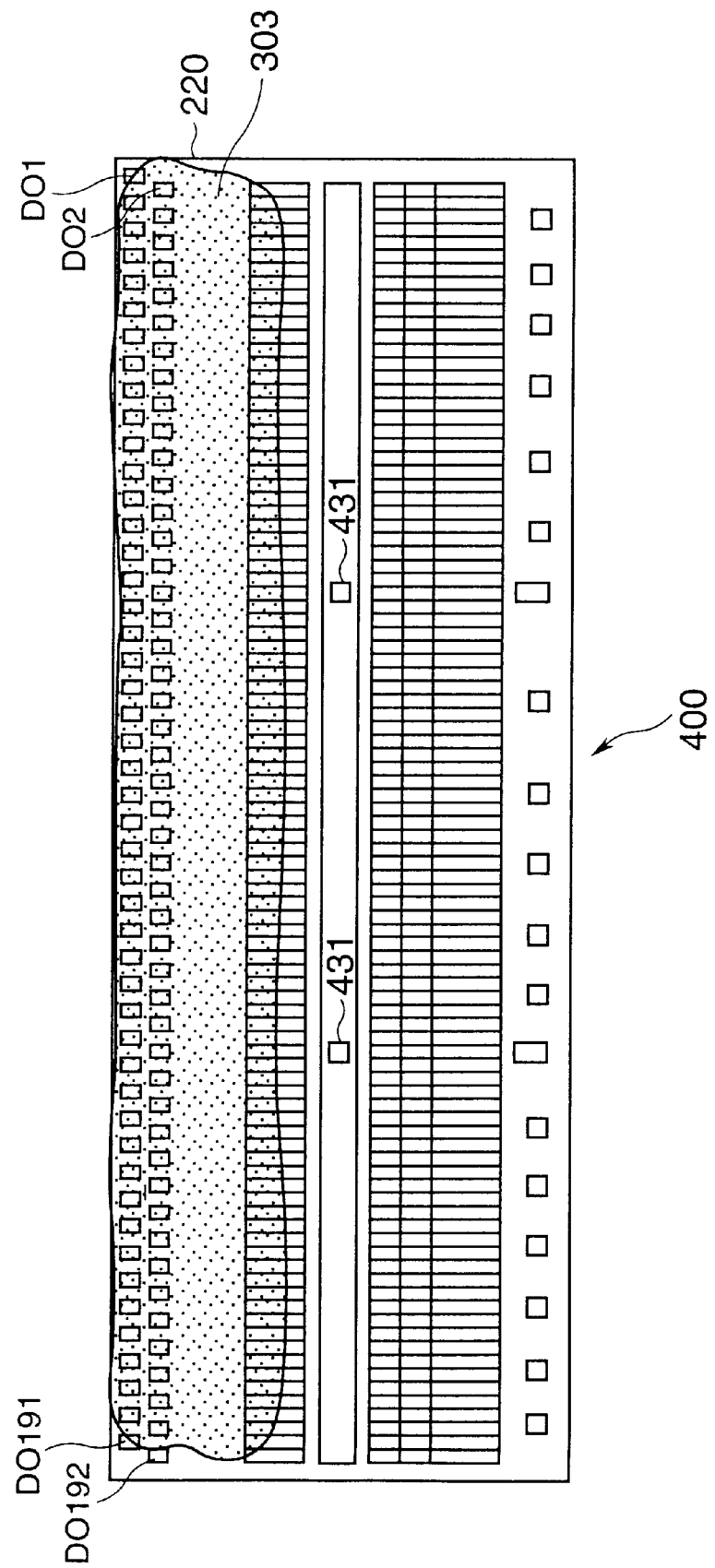
FIG. 20 illustrates the ACF used in the prior art chip module when the ACF is crushed between the driver IC and LED array.

FIG. 15 is similar to FIG. 20 and illustrates the ACF 303 that spreads over the driver IC 200C when the LED array 100C is electrically connected to the driver IC 200C through the ACF sandwiched therebetween.

Referring to FIG. 15, the dummy electrode pads DUMMY 1–DUMMY 4 effectively increases the number of drive electrode pads. Therefore, the ACF 303 experiences substantially the same fluid resistance until at least the ACF completely covers the drive electrode pads spreads DO1, DO2, DO191, and DO192.

A LED array, which is connected to the drive IC 200C by the use of the ACF, may be replaced by the same as the LED array 100 (FIG. 17) which has no dummy driven electrode pads LDUMMY 1 to LDUMMY 4.

Fourth embodiment

Figure 16:
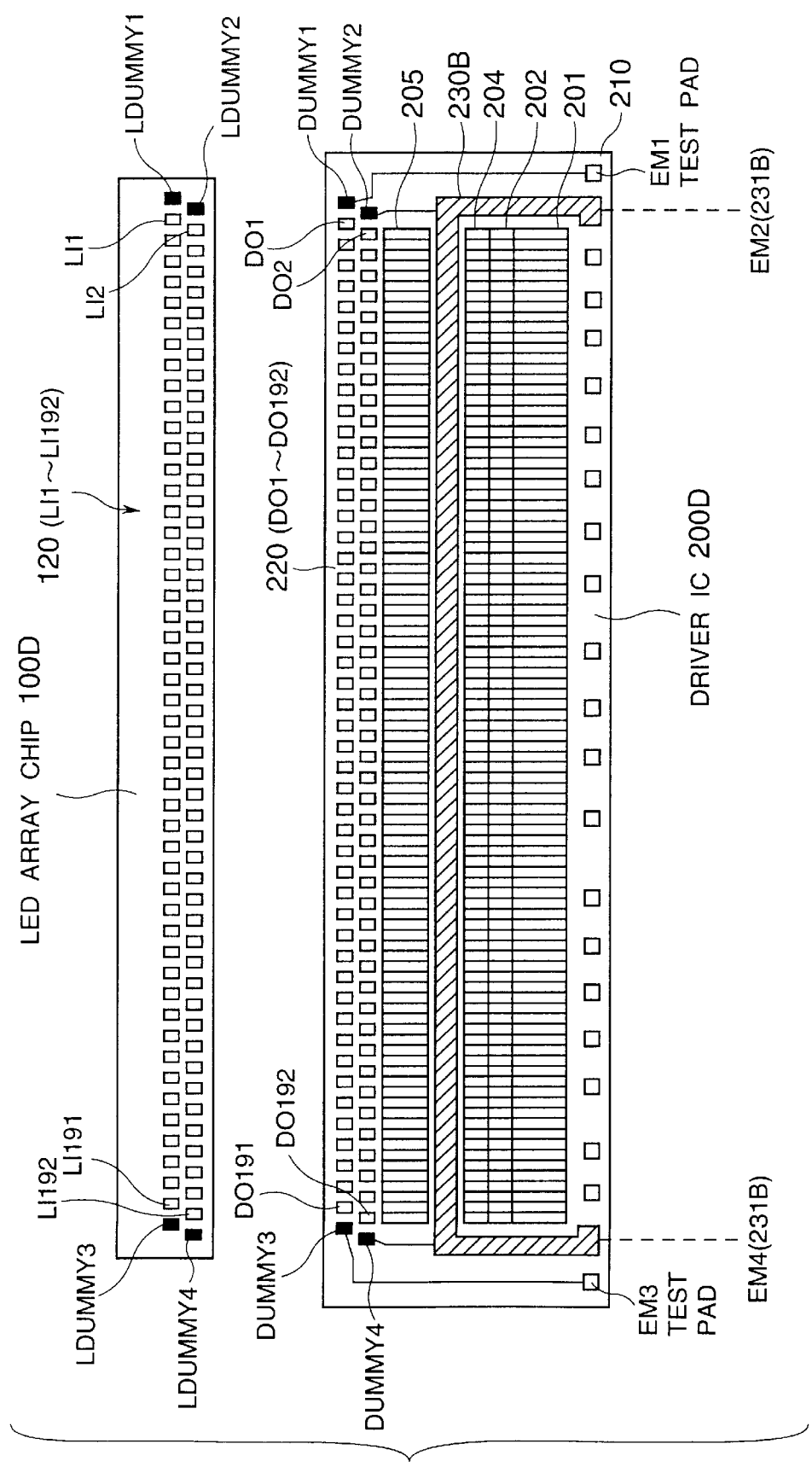
FIG. 16 illustrates a layout of a driver IC according to a fourth embodiment.

FIG. 16 illustrates a layout of a driver IC 200D according to a fourth embodiment. Elements similar to those of the driver IC 200C of the third embodiment have been given the same reference numerals. FIG. 16 also shows an LED array 100D that is connected with the driver IC 200D by the use of the ACF. It is to be noted that the LED array 100D is shown as a see-through view.

The driver IC 200D differs from the driver IC 200C in that test pads EM1, EM2, EM3, and EM4 are provided and are connected to the dummy electrode pads DUMMY 1, DUMMY 2, DUMMY 3, and DUMMY 4, respectively. The test pads EM2 and EM4 serve as both test pads and supply electrode pads 231B but may be provided independently of the supply electrode pads 231B. If the test pads EM2 and EM4 are provided independently of the supply electrode pads 231B, the dummy electrode pads DEMMY 2 and DEMMY 4 are not connected to the supply electrode pads 231B but to the test pads EM2 and EM4.

The LED array 100D differs from the LED array 100C of FIG. 13 in that the dummy driven electrode pads LDUMMY 1, LDUMMY 2, LDUMMY 3, and LDUMMY 4 are provided corresponding to the dummy electrode pads DUMMY 1, DUMMY 2, DUMMY 3, and DUMMY 4, respectively.

In a chip module (cross-section is the same as FIG. 13) when the LED array 100D has been connected by the use of the ACF to the driver IC 200D, the DUMMY 1 is connected to LDUMMY 1 through the ACF. The LDUMMY 2 is connected to the DUMMY 2 through the ACF. Therefore, the test pad EM1 is electrically continuous to the test pad EM2 (supply electrode pad 231B) through DUMMY 1, ACF, LDUMMY 1, LDUMMY 2, ACF, and DUMMY 2.

Likewise, the test pad EM3 is connected to the test pad EM4 (supply electrode pad 230B) through DUMMY 3, ACF, LDUMMY 3, LDUMMY 4, ACF, and DUMMY 4.

The prior art chip modules (FIG. 18) incorporating the LED array 100 and driver IC 400 used to be tested after the manufacture as follows:

Signals required for individually testing the LEDs of the LED array 100 were applied through probe pins to the input electrode pads of the driver IC 400. The individual LEDs were energized to emit light and the light emitted from the LEDs was measured with a photo power meter individually. If the emissions of an LED array fall outside of a predetermined range, the LED array is simply rejected.

An average power of emitted light was computed for each chip module. Chip modules that fall in the same range of variation of power are mounted on the same printed circuit board. In this manner, adjacent chip modules emit light with substantially the same power; thereby preventing poor print quality.

Since the aforementioned inspection is performed on a module-by-module basis, it is difficult to locate a specific defective part of the chip module. Rejection of a chip module may be due to variation in emission of individual LEDs of the LED array or to variation in drive current resulting from manufacturing variations of the driver IC 400. Another cause may be the resistance of the ACF between the anode electrode pad LIi of the LED array and the corresponding drive electrode pad DOi of the driver IC 400.

Even if the resistance of the ACF has increased abnormally for some reason, it is difficult to measure the resistance of the ACF between the anode electrode pad LIi and the drive electrode pad DOi. The only way of detecting the abnormal resistance of the ACF would be to carry out a destructive examination. In other words, the LED array 100 is forcibly removed from the chip module. The appearance of the residual ACF on the driver IC 400 is checked. Finally, the number of conductive particles is counted only to estimate the resistance of the ACF.

The chip module according to the fourth embodiment that consists of the LED array 100D and driver IC 200D has the test pads EM1, EM2, EM3, and EM4 provided at locations where probe pins can reach. The test pads EM1 and EM2 are connected through a path of DUMMY 1→ACF→LDUMMY 1→LDUMMY 2→ACF→DUMMY 2. The test pads EM3 and EM4 are connected through a path of DUMMY 3→ACF→LDUMMY 3→LDUMMY 4→ACF→DUMMY 4. Thus, measuring the resistance between the test pads EM1 and EM2 and the resistance between the test pads EM3 and EM4 can detect good ACF connection and bad ACF connection between the drive electrode pad DOi and the anode electrode pad LIi without having to destroy the chip module.

While the aforementioned first to fourth embodiments have been described with respect to a driver IC for driving a LED array, the driver IC of the invention can also be applicable to a driver IC that drives a set of heat-generating resistors for use in a thermal printer and to a driver IC that drives a set of display elements in a display.

The present invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A driver IC chip having a plurality of drive-elements that drive driven-elements in a driven IC chip, comprising:

a plurality of drive-elements aligned at predetermined intervals;

a power-supplying electrode extending along said plurality of drive-elements and distributing electric power to said plurality of drive-elements; and a plurality of power-supplying electrode pads provided on said power-supplying electrode and receiving electric power from outside and supplying the electric power to said power-supplying electrode;

wherein an n-th power-supplying electrode pad is positioned at a location given by $$L(2n-1)/2N$$

where N is a number of said power-supplying electrode pads, n is an integer from 1 to N, and L is a total length of said power-supplying electrode.

2. The driver IC according to claim 1, wherein the driven elements are light-emitting diodes.

3. A driver IC chip having a plurality of drive-elements which drive corresponding ones of a plurality of driven elements, comprising:

a row of a plurality of drive-elements;

a power-supplying electrode extending along the row and distributing electric power to said plurality of drive-elements, said power-supplying electrode having an Au electrode layer;

power-supplying electrode pads provided on said power-supplying electrode and receiving electric power from outside; and a row of plurality of drive-electrode pads through which said plurality of drive-elements are connected to corresponding ones of said driven elements.

4. The driver IC chip according to claim 3, wherein said drive-elements are aligned along the row of said drive-electrode pads;

said power-supplying electrode has an Au electrode layer generally in a shape of U such that the Au electrode layer extending beyond the row of said drive-elements and then extending in a direction perpendicular to the row; and said power-supplying electrode pads are provided on free end portions of said Au electrode layer.

5. The driver IC chip according to claim 4, wherein said drive-electrode pads have an Au bump thereon and said Au electrode layer is formed as high as the Au bump when the Au bump is formed.

6. The driver IC according to claim 5, wherein the driven elements are light-emitting diodes.

7. A driver IC chip having a plurality of drive-elements which drive corresponding ones of a plurality of driven elements, comprising:

a row of a plurality of drive-elements aligned at predetermined intervals;

a row of a plurality of drive-electrode pads through which said plurality drive-elements are connected to corresponding ones of said driven elements;

at least one dummy drive-electrode pad positioned next to each of end most ones of the plurality of drive-electrode pads, said at least one dummy drive-electrode pad being of the same size as said drive-electrode pads and being positioned at the same intervals as said plurality of drive-electrode pads.

8. The driver IC according to any one of claims 7, further having an area in which the driven IC is mounted with an anisotropic conductive film sandwiched between the driver IC chip and the driven IC chip.

9. A chip module comprising a driver IC chip and a driven IC chip mounted on and driven by the driver IC, the driver IC chip having a plurality of drive-elements which drive corresponding ones of a plurality of driven-elements of the driven IC chip, the driven IC chip being mechanically and electrically connected to the driver IC chip through an anisotropic film (ACF), wherein the driver IC chip comprising:

a plurality of drive-elements aligned at predetermined intervals;

a plurality of drive-electrode pads through which said plurality of drive-elements are connected to corresponding ones of said driven-elements, said plurality of drive-electrode pads being aligned at the predetermined intervals;

at least first and second dummy drive-electrode pads positioned next to each of endmost ones of the plurality of drive-electrode pads, said first and second dummy drive-electrode pads being of a same size as said drive-electrode pads and being positioned at same intervals as said plurality of drive-electrode pads;

at least first and second test pads connected to said first and second dummy electrode pads, respectively, said at least first and second test pads being positioned outside an area in which the driven IC is mounted;

wherein the driven IC comprising:

a plurality of driven elements aligned at predetermined intervals, said plurality of driven elements being driven by said drive-elements;

a plurality of driven electrode pads through which said plurality driven elements are connected to corresponding ones of said drive-elements, said plurality of driven electrode pads being aligned at the predetermined intervals;

at least first and second dummy driven electrode pads (LDUMMY1–LDUMMY2) positioned next to of endmost ones of the plurality of driven electrode pads, said at least first and second dummy driven electrode pads being aligned with said at least first and second dummy drive-electrode pads when the driven IC chip is mounted to the driver IC chip, said first and second dummy driven electrode pads being electrically connected to each other through the ACF;

wherein when the driven IC chip is mounted on the driver IC chip with the anisotropic film sandwiched therebetween, said first and second test pads have electrical continuity through the anisotropic film.

10. The chip module according to claim 9, further comprising a power-supplying electrode that extends along the drive-elements and supplies electric power to the drive-elements, said second dummy electrode pad and said second test pad are connected to said power-supplying electrode.

11. The chip module according to claim 9, wherein said driven elements are light emitting diodes.

* * * * *